U S 012125902B2

United States Patent
Chou et al.

(10) Patent No.: US 12,125,902 B2
(45) Date of Patent: *Oct. 22, 2024

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Yi-Lun Chou, Suzhou (CN); Kye Jin Lee, Suzhou (CN); Han-Chin Chiu, Suzhou (CN); Xiuhua Pan, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 162 days.

This patent is subject to a terminal disclaimer.

(21) Appl. No.: 17/384,837

(22) Filed: Jul. 26, 2021

(65) Prior Publication Data

US 2022/0328674 A1 Oct. 13, 2022

Related U.S. Application Data

(63) Continuation of application No. 17/420,717, filed as application No. PCT/CN2021/086528 on Apr. 12, 2021.

(51) Int. Cl.
*H01L 29/778* (2006.01)

(52) U.S. Cl.
CPC .................. *H01L 29/7783* (2013.01)

(58) Field of Classification Search
CPC ........... H01L 29/7783; H01L 21/02458; H01L 21/02505; H01L 21/02507; H01L 21/0251;

(Continued)

(56) References Cited

U.S. PATENT DOCUMENTS 5,604,356 A  2/1997  Shiraishi
8,963,164 B2  2/2015  Shimizu et al.
(Continued)

FOREIGN PATENT DOCUMENTS

CN  103367421 A  10/2013
CN  103403840 A  11/2013
(Continued)

OTHER PUBLICATIONS

International Search Report and Written Opinion of the corresponding PCT application No. PCT/CN2021/086528 mailed on Jan. 14, 2022.

(Continued)

*Primary Examiner* — Nicholas J Tobergte
*Assistant Examiner* — Adin Hrnjic
(74) *Attorney, Agent, or Firm* — JCIPRNET

(57) ABSTRACT

A semiconductor device includes a substrate, a nucleation layer, a buffer layer, first and second nitride-based semiconductor layers, a pair of S/D electrodes, and a gate electrode. The nucleation layer includes a compound which includes a first group III element and is devoid of a second group III element. The buffer layer includes a III-V compound which includes the first and second group III elements. The buffer layer has an element ratio of the first group III element to the second group III element that decrementally decreases and then incrementally increases as a function of a distance within a thickness of the buffer layer. The first nitride-based semiconductor layer is disposed on the buffer layer. The second nitride-based semiconductor layer is disposed on the first nitride-based semiconductor layer. The S/D electrodes and a gate electrode are disposed over the second nitride-based semiconductor layer.

16 Claims, 16 Drawing Sheets

(58) Field of Classification Search
CPC ............. H01L 21/0254; H01L 29/1066; H01L 29/1075; H01L 29/2003; H01L 29/7786
See application file for complete search history.

(56) References Cited

U.S. PATENT DOCUMENTS

| | | | |
|---|---|---|---|
| 9,276,066 | B2 | 3/2016 | Tamura et al. |
| 9,508,822 | B2 | 11/2016 | Oka et al. |
| 9,608,075 | B1 | 3/2017 | Wan et al. |
| 9,653,589 | B2 | 5/2017 | Umeno et al. |
| 9,923,061 | B2 | 3/2018 | Bavard et al. |
| 10,186,421 | B2 | 1/2019 | Fukazawa et al. |
| 10,332,876 | B2 | 6/2019 | Siemieniec et al. |
| 11,581,269 | B2 | 2/2023 | Park et al. |
| 11,869,942 | B2 | 1/2024 | Thapa et al. |
| 2005/0110043 | A1 | 5/2005 | Otsuka et al. |
| 2010/0244096 | A1 | 9/2010 | Sato |
| 2011/0272665 | A1 | 11/2011 | Yamaguchi et al. |
| 2011/0297961 | A1* | 12/2011 | Bunin ............... H01L 29/42316 257/E29.091 |
| 2014/0061665 | A1* | 3/2014 | Tsuchiya ........... H01L 21/02458 257/76 |
| 2014/0091318 | A1 | 4/2014 | Ishiguro et al. |
| 2015/0076449 | A1 | 3/2015 | Yamada |
| 2015/0372124 | A1 | 12/2015 | Isobe et al. |
| 2016/0072386 | A1 | 3/2016 | Saito |
| 2018/0097072 | A1 | 4/2018 | Briere |
| 2018/0323265 | A1 | 11/2018 | Liu et al. |
| 2019/0221648 | A1* | 7/2019 | Liu ....................... H01L 29/205 |
| 2019/0348411 | A1 | 11/2019 | Chen et al. |
| 2021/0126118 | A1 | 4/2021 | Baines et al. |
| 2021/0151591 | A1* | 5/2021 | Chen .................. H01L 29/7782 |
| 2022/0328672 | A1 | 10/2022 | Chou et al. |
| 2022/0328675 | A1 | 10/2022 | Chou et al. |
| 2022/0328677 | A1 | 10/2022 | Chou et al. |
| 2022/0328678 | A1 | 10/2022 | Chou et al. |
| 2023/0072850 | A1 | 3/2023 | Chou et al. |
| 2023/0290873 | A1 | 9/2023 | Lin et al. |

FOREIGN PATENT DOCUMENTS

| | | |
|---|---|---|
| CN | 104465743 A | 3/2015 |
| CN | 109103099 A | 12/2018 |
| CN | 111490100 A | 8/2020 |
| WO | 2010044978 A1 | 4/2010 |

OTHER PUBLICATIONS

First Office Action of corresponding China patent application No. 202180005980.2 mailed on Nov. 30, 2022.

United States Patent and Trademark Office, non-final office action, Office Action Issued in U.S. Appl. No. 17/384,832, Sep. 6, 2023, 21 pages.

United States Patent and Trademark Office, non-final office action, Office Action Issued in U.S. Appl. No. 17/384,839, Oct. 16, 2023, 20 pages.

United States Patent and Trademark Office, non-final office action, Office Action Issued in U.S. Appl. No. 17/420,717, Oct. 30, 2023, 28 pages.

United States Patent and Trademark Office, non-final office action, Office Action Issued in U.S. Appl. No. 17/384,831, Nov. 16, 2023, 24 pages.

United States Patent and Trademark Office, non-final office action, Office Action Issued in U.S. Appl. No. 17/384,833, Nov. 16, 2023, 23 pages.

United States Patent and Trademark Office, final office action Issued in U.S. Appl. No. 17/384,831, Feb. 14, 2024, 21 pages.

United States Patent and Trademark Office, final office action Issued in U.S. Appl. No. 17/420,717, Feb. 9, 2024, 18 pages.

United States Patent and Trademark Office, Requirement Restriction Issued in U.S. Appl. No. 17/380,044, Jan. 22, 2024, 6 pages.

United States Patent and Trademark Office, non-final office action Issued in U.S. Appl. No. 17/384,835, Dec. 8, 2023, 27 pages.

United States Patent and Trademark Office, non-final office action Issued in U.S. Appl. No. 17/384,838, Dec. 11, 2023, 27 pages.

United States Patent and Trademark Office, non-final office action Issued in U.S. Appl. No. 17/420,718, Jan. 3, 2024, 31 pages.

United States Patent and Trademark Office, non-final office action issued in U.S. Appl. No. 17/380,040, filed Jun. 11, 2024, 33 pages.

United States Patent and Trademark Office, non-final office action issued in U.S. Appl. No. 17/380,041, filed Jun. 11, 2024, 33 pages.

United States Patent and Trademark Office, non-final office action issued in U.S. Appl. No. 17/380,044, filed Mar. 28, 2024, 31 pages.

United States Patent and Trademark Office, Advisory Action issued in U.S. Appl. No. 17/384,831, filed Apr. 19, 2024, 6 pages.

United States Patent and Trademark Office, Second non-final office action issued in U.S. Appl. No. 17/384,831, filed Jun. 4, 2024, 17 pages.

United States Patent and Trademark Office, final office action issued in U.S. Appl. No. 17/384,833, filed Apr. 18, 2024, 19 pages.

United States Patent and Trademark Office, Advisory Action issued in U.S. Appl. No. 17/384,835, filed May 28, 2024, 5 pages.

United States Patent and Trademark Office, Advisory Action issued in U.S. Appl. No. 17/384,838, filed May 24, 2024, 6 pages.

United States Patent and Trademark Office, final office action issued in U.S. Appl. No. 17/384,839, filed Apr. 2, 2024, 21 pages.

United States Patent and Trademark Office, Advisory Action issued in U.S. Appl. No. 17/420,717, filed Apr. 22, 2024, 5 pages.

United States Patent and Trademark Office, Second non-final office action issued in U.S. Appl. No. 17/420,717, filed Jun. 4, 2024, 17 pages.

* cited by examiner

SEMICONDUCTOR DEVICE AND METHOD FOR MANUFACTURING THE SAME

CROSS-REFERENCES TO RELATED APPLICATIONS

This application is a continuation application of U.S. application Ser. No. 17/420,717, filed on Jul. 6, 2021, which is a national phase application of PCT/CN2021/086528 filed on Apr. 12, 2021, the disclosure of which are incorporated herein by reference in their entirety.

FIELD OF THE INVENTION

The present invention generally relates to a semiconductor device. More specifically, the present invention relates to a high electron mobility transistor (HEMT) semiconductor device having a buffer layer with an oscillatory concentration of group III element.

BACKGROUND OF THE INVENTION

In recent years, intense research on high-electron-mobility transistors (HEMTs) has been prevalent for semiconductor devices, such as high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HEMT devices, thereby making them suitable for mass production.

SUMMARY OF THE INVENTION

In accordance with one aspect of the present disclosure, a semiconductor device includes a substrate, a nucleation layer, a buffer layer, a first nitride-based semiconductor layer, a second nitride-based semiconductor layer, a pair of source/drain (S/D) electrodes, and a gate electrode. The nucleation layer includes a compound which includes a first element. The nucleation layer is disposed on the substrate and forms an interface with the substrate. The buffer layer includes a III-V compound which includes the first element. The buffer layer is disposed on the nucleation layer and forms an interface with the nucleation layer. The buffer layer has a variable concentration of the first element that incrementally increases and then decrementally decreases as a function of a distance within a thickness of the buffer layer, in which the incremental increase and the decremental decrease occur with respect to a first reference point within the buffer layer. The first nitride-based semiconductor layer is disposed on the buffer layer and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes and a gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, a pair of S/D electrodes, and a gate electrode. The nucleation layer comprising a compound includes a first element and is disposed on and forming an interface with the substrate. The buffer layer includes a III-V compound that includes the first element. The buffer layer is disposed on and forms an interface with the nucleation layer. The buffer layer has a variable concentration of the first element that decrementally decreases and then incrementally increases as a function of a distance within a thickness of the buffer layer, in which the decremental decrease and the incremental increase occur with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and the gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, a pair of S/D electrodes, and a gate electrode. The nucleation layer includes a compound which includes a first group III element and is devoid of a second group III element, and the nucleation layer is disposed on and forms an interface with the substrate. The buffer layer includes a III-V compound which includes the first and second group III elements. The buffer layer is disposed on and forms an interface with the nucleation layer. The buffer layer has a variable concentration of the second group III element that incrementally increases and then decrementally decreases as a function of a distance within a thickness of the buffer layer, in which the incremental increase and decremental decrease occur with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and a gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, a pair of S/D electrodes, and a gate electrode. The nucleation layer includes a compound which includes a first group III element and is devoid of a second group III element, and the nucleation layer is disposed on and forms an interface with the substrate. The buffer layer includes a III-V compound which includes the first and second group III elements. The buffer layer is disposed on and forms an interface with the nucleation layer. The buffer layer has a variable concentration of the second group III element that decrementally decreases and then incrementally increases as a function of a distance within a thickness of the buffer layer, in which the decremental decrease and incremental increase occur with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and the gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, a pair of S/D electrodes, and a gate electrode. The nucleation layer includes a compound which includes a first group III element and is devoid of a second group III element, and the nucleation layer is disposed on and forms an interface with the substrate. The buffer layer includes a III-V compound which includes the first and second group III elements. The buffer layer is disposed on and forms an interface with the nucleation layer. The buffer layer has an element ratio of the first group III element to the second group III element that incrementally increases and then decrementally decreases as a function of a distance within a thickness of the buffer layer such that the buffer layer has a variable lattice constant in accordance with change of the element ratio, in which the incremental increase and decremental decrease occur with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and the gate electrode are disposed over the second nitride-based semiconductor layer, wherein the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, a pair of S/D electrodes, and a gate electrode. The nucleation layer includes a compound which includes a first group III element and is devoid of a second group III element, and the nucleation layer is disposed on and forms an interface with the substrate. The buffer layer includes a III-V compound which includes the first and second group III elements. The buffer layer is disposed on and forms an interface with the nucleation layer. The buffer layer has an element ratio of the first group III element to the second group III element that decrementally decreases and then incrementally increases as a function of a distance within a thickness of the buffer layer such that the buffer layer has a variable lattice constant in accordance with change of the element ratio, in which the decremental decrease and incremental increase occur with respect to a first reference point within the buffer layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and a gate electrode are disposed over the second nitride-based semiconductor layer, in which the gate electrode is between the S/D electrodes.

In accordance with one aspect of the present disclosure, a semiconductor device includes a substrate, a nucleation layer, a buffer layer, a first nitride-based semiconductor layer, a second nitride-based semiconductor layer, a pair of S/D electrodes, and a gate electrode. The nucleation layer includes a compound which includes a first element, and the nucleation layer is disposed on and forms an interface with the substrate. The buffer layer includes a III-V compound which includes the first element. The buffer layer is disposed on and forms an interface with the nucleation layer. The buffer layer has a concentration of the first element cyclically oscillating with respect to first and second reference points within a buffer layer, in which the first and second reference points are respectively positioned at first and second distances from a top surface of the nucleation layer. The first nitride-based semiconductor layer is disposed on and forms an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and a gate electrode disposed over the second nitride-based semiconductor layer, in which the gate electrode is between the S/D electrodes.

In accordance with one aspect of the present disclosure, a semiconductor device includes a substrate, a nucleation layer, a first buffer layer, a first nitride-based semiconductor layer, a second buffer layer, a second nitride-based semiconductor layer, a third nitride-based semiconductor layer, and a pair of S/D electrodes, and a gate electrode. The nucleation layer includes a compound which includes a first element, and the nucleation layer is disposed on and forms an interface with the substrate. The first buffer layer includes a III-V compound which includes the first element, the first buffer layer disposed on and forming an interface with the nucleation layer. A concentration of the first element varies with respect to a first reference point within the first buffer layer. The first nitride-based semiconductor layer is disposed on and forms an interface with the first buffer layer. The second buffer layer includes a III-V compound which includes a second element different than the first element. The second buffer layer is disposed on and forms an interface with the first nitride-based semiconductor layer. A concentration of the second element varies to cyclically oscillate as a function of a distance within a thickness of the second buffer layer, which occurs with respect to a second reference point within the second buffer layer. The second nitride-based semiconductor layer is disposed on and forms an interface with the second buffer layer. The third nitride-based semiconductor layer is disposed on the second nitride-based semiconductor layer and has a bandgap greater than a bandgap of the second nitride-based semiconductor layer, so as to form a heterojunction therebetween with a 2DEG region. The S/D electrodes and the gate electrode are disposed over the third nitride-based semiconductor layer, in which the gate electrode is between the S/D electrodes.

By applying the above configuration, the variable concentration of aluminum has the decremental decreases and the incremental increases, such that the trend of the variable concentration of aluminum can reverse, which would turn the trend of the curvature of the buffer layer. The curvature can be avoided to become very positive or negative. As such a layer to be formed on the buffer layer (e.g. the nitride-based semiconductor layer) can have quality improved. That is, the curvature can be controllable in a desired range. Thereafter, the growth of the buffer layer is acceptable for running the subsequent process (e.g. formation of the nitride-based semiconductor layer on the buffer layer).

Accordingly, the yield rate for the semiconductor device during the process for manufacturing the same is improved.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
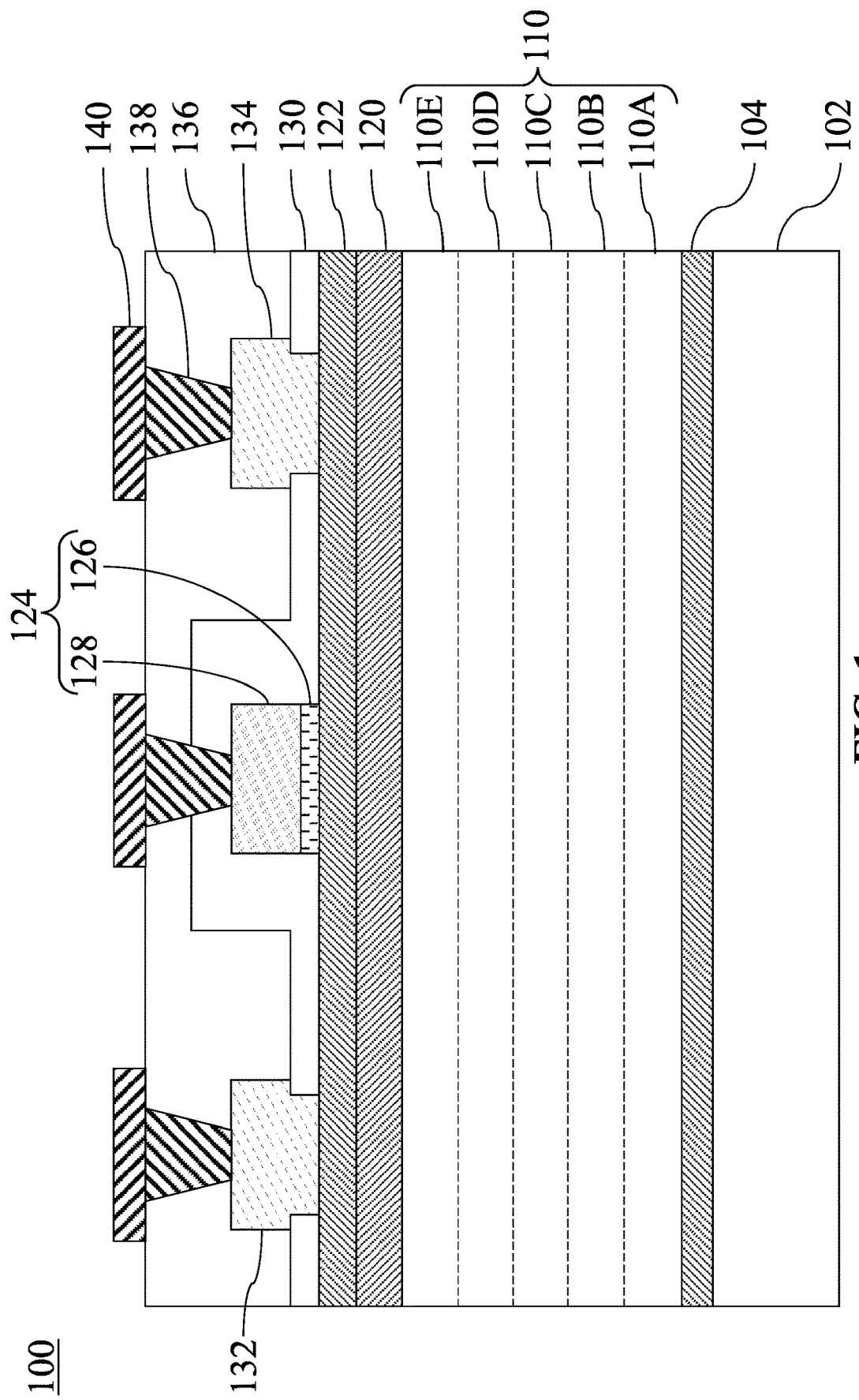
FIG. 1 is a cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor devices/semiconductor die, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a cross-sectional view of a semiconductor device 100 according to some embodiments of the present disclosure. The semiconductor device 100 includes a substrate 102, a nucleation layer 104, a buffer layer 110, nitride-based semiconductor layers 120 and 122, a gate structure 124, a passivation layer 130, a pair of source/drain (S/D) electrodes 132 and 134, a passivation layer 136, vias 138, and a patterned conductive layer 140.

The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example but are not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxy (epi) layer, or combinations thereof.

The nucleation layer 104 is formed on the substrate 102. The nucleation layer 104 may form an interface with the substrate 102. The nucleation layer 104 is configured to provide a top surface for growth of III-nitride material thereon. In other words, the nucleation layer 104 forms an appropriate template to transition from lattice of the substrate to a template more suitable for growth of III-nitride material. The nucleation layer 104 can provide a transition to accommodate a mismatch/difference between the substrate 102 and a III-nitride layer to be formed on the top surface thereof (e.g. epitaxially formation). The mismatch/difference may refer to different lattice constants or thermal expansion coefficients. The mismatch/difference might cause dislocation in the formed layer and thus the yield rate is reduced. The exemplary material of the nucleation layer 104 can include, for example but is not limited to AlN or any of its alloys. The AlN may be, for example, but is not limited to doped n-type, p-type, or intrinsic. The material(s) of the nucleation layer can be selected to cur the mismatch/difference. For example, in order to accommodate a mismatch/difference due to a first element in a layer to be formed on the nucleation layer, the nucleation layer 104 is formed with including the first element.

The buffer layer 110 is formed on the nucleation layer 104. The buffer layer 110 may form an interface with the nucleation layer 104. The buffer layer 110 has a bottom-most surface in contact with the nucleation layer 104. The interface is formed by the bottom-most surface of the buffer layer 110 and a top-most surface of the nucleation layer 104. The buffer layer 110 has a top-most surface opposite the bottom-most surface. The buffer layer 110 is configured to reduce lattice and thermal mismatches between the underlying layer and a layer to be formed on the buffer layer 110 (e.g. epitaxially formed thereon), thereby curing defects due to the mismatches/difference.

The buffer layer 110 includes a III-V compound. The III-V compound can include, for example but are not limited to, aluminum, gallium, indium, nitride, or combinations thereof. Accordingly, the exemplary materials of the buffer layer 110 can further include, for example but are not limited to, AlN, AlGaN, InAlGaN, or combinations thereof. In some embodiments, the buffer layer 110 may include two kinds of group III elements, and the nucleation layer only has one kind of the group III elements. For example, the nucleation layer includes a compound which includes aluminum and is devoid of gallium (e.g. AlN), and the buffer layer 110 includes a III-V compound which includes aluminum and gallium (e.g. AlGaN).

The nitride-based semiconductor layer 120 is disposed over the buffer layer 110. The exemplary materials of the nitride-based semiconductor layer 120 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$. The nitride-based semiconductor layer 122 is disposed on the nitride-based semiconductor layer 120. The exemplary materials of the nitride-based semiconductor layer 122 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$.

The exemplary materials of the nitride-based semiconductor layers 120 and 122 are selected such that the nitride-based semiconductor layer 122 has a bandgap (i.e. forbidden band width) greater than a bandgap of the nitride-based semiconductor layer 120, which causes electron affinities thereof different from each other and forms a heterojunction therebetween. For example, when the nitride-based semiconductor layer 120 is an undoped GaN layer having bandgap of approximately 3.4 eV, the nitride-based semiconductor layer 122 may be an AlGaN layer having bandgap of approximately 4.0 eV. As such, the nitride-based semiconductor layers 120 and 122 serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the semiconductor device 100 can include at least one GaN-based high-electron-mobility transistor (HEMT).

In a case that the nitride-based semiconductor layer 120 is devoid of aluminum, the buffer layer 110 including aluminum gallium nitride (AlGaN) is formed to reduce lattice and thermal mismatches between the underlying layer (e.g. the substrate 102) and the nitride-based semiconductor layer 120. For the purpose of reducing lattice and thermal mismatches, as the nitride-based semiconductor layer 120 includes gallium nitride (GaN) and the nitride-based semiconductor layer 122 includes aluminum gallium nitride (AlGaN), the nucleation layer 104 and the buffer layer can be selected to include aluminum nitride (AlN) and aluminum gallium nitride (AlGaN), respectively. To illustrate, the buffer layer 110 of the present embodiment includes aluminum gallium nitride (AlGaN), and it is for the exemplary purpose and the present disclosure is not limited thereto.

Although a buffer layer can be formed to cure defects as stated above, over-accumulated stresses during the growth of a buffer layer may affect a layer to be formed on the buffer layer. Over-accumulated stresses will affect a yield rate of a semiconductor device.

In this regard, the buffer layer 110 can have a variable concentration of a group III element to solve such issues. One of the reasons to design the concentration of the group III element as being variable is to prevent the buffer layer 110 or a layer formed on the buffer layer 110 (e.g. the nitride-based semiconductor layer 120) from bending due to over-accumulated stress. For example, as the buffer layer 110 includes AlGaN, the buffer layer 110 may have a variable concentration of aluminum. Herein, the variable concentration may refer to include both an increasing trend and a decreasing trend in the concentration. The variable concentration may increase and then decrease. The variable concentration may decrease and then increase. The increase may include an incremental increase. The decrease may include a decremental decrease.

Figure 2A:
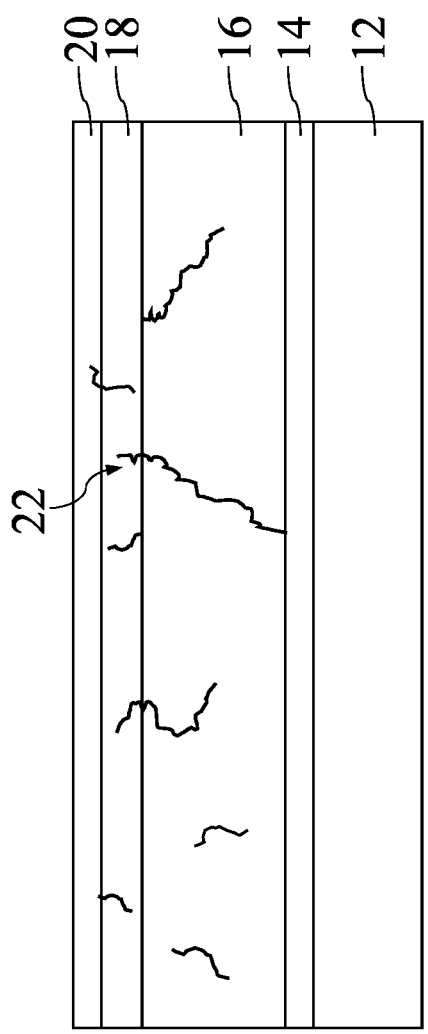
FIG. 2A is a cross-section view schematically showing a manufacturing stage for a semiconductor device according to a comparative embodiment.
Figure 2B:
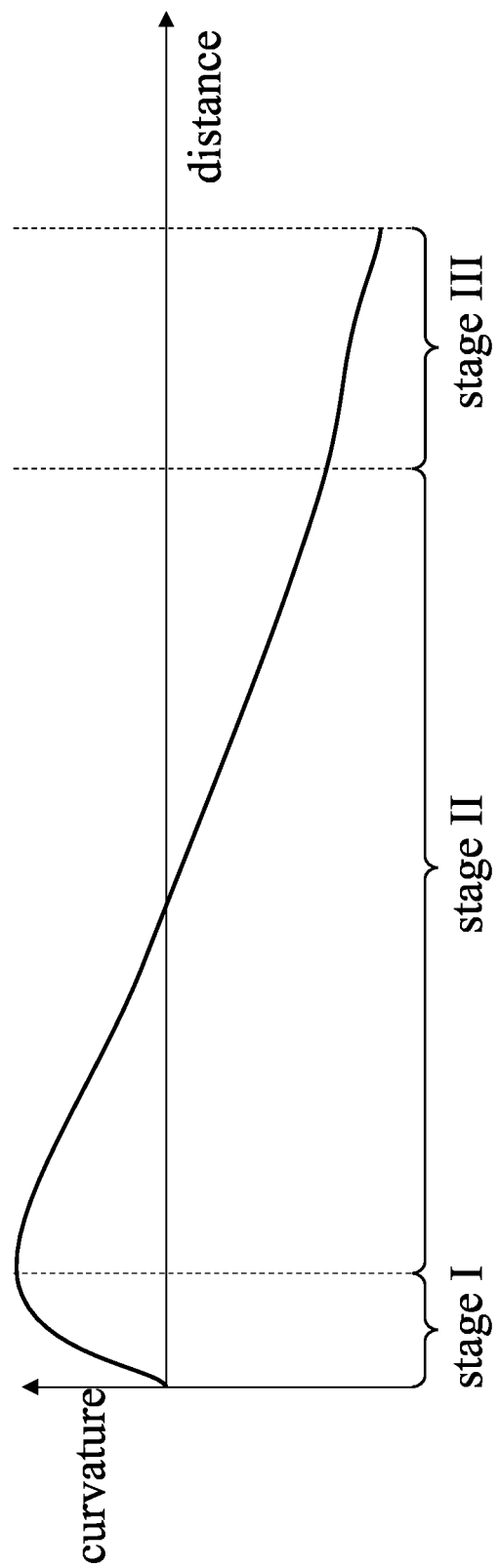
FIG. 2B is a graph showing curvature versus a distance within a thickness of a buffer layer of the semiconductor device of FIG. 2A.

To demonstrate how a concentration can affect a yield rate, FIG. 2A is a cross-section view schematically showing a manufacturing stage for a semiconductor device 10 according to a comparative embodiment, and FIG. 2B is a graph showing curvature versus a distance within a thickness of a buffer layer of the semiconductor device 10 of FIG. 2A. As shown in FIG. 2A, an nucleation layer 14, a buffer layer 16, and nitride-based semiconductor layers 18 and 20 are formed on a substrate 12 in sequence. In the comparative embodiment, the nucleation layer 14 is made of aluminum nitride (AlN), the buffer layer is made of aluminum gallium nitride (AlGaN), the nitride-based semiconductor layer 18 is made of gallium nitride (GaN), and the nitride-based semiconductor layer 20 is made of aluminum gallium nitride (AlGaN).

The distance of FIG. 2B can refer to a distance from a top surface of the substrate 102. As shown in FIG. 2B, there are three stages I, II, and III, in which the stage I is the formation of the nucleation layer 14; the stage II is the formation of the buffer layer 16; and the stage III is the formation of the nitride-based semiconductor layer 18.

In the stage I, with the growth of the nucleation layer 14, the curvature increases due to accumulation of stress during the formation. In the stage II, the buffer layer 16 is formed for curing the aforementioned mismatches/difference. Accordingly, an aluminum concentration of the buffer layer 16 gradually decreases without increase as the growth of buffer layer 16 goes. The gradual decrease of the aluminum concentration is made for matching the properties of the nitride-based semiconductor layer 18 to be formed thereon. It is found that the trend of the aluminum concentration correlates with that of the curvature. That is, as the aluminum concentration continuously decreases, the curvature goes to the single direction. Accordingly, at the end of the formation of the buffer layer 16, the degree of the curvature is large (e.g. very positive curvature or very negative curvature). Thereafter, in the stage III, as growth of the nitride-based semiconductor layer 18, the curvature continuously develops along the single direction. Eventually, such degree of the curvature will result in warpage in the formed layer. For example, once the warpage occurs at the nitride-based semiconductor layer 18, cracks or voids 22 may appear in the same, which reduces quality of the nitride-based semiconductor layer 18 and reduces the yield rate of the final product as well. Therefore, the curvature issue resulted from the growth of the buffer layer exists in the manufacturing process. In the exemplary illustration of FIG. 2A, the cracks or voids 22 can result from lattice mismatch or coefficient of thermal expansion (CTE) mismatch. For the lattice mismatch, the cracks or voids 22 may start from an interface between two layers (e.g. being from an interface between the substrate 13 and the nucleation layer 14). For the CTE mismatch, the cracks or voids 22 may appear at any position within an epitaxy layer, such as the buffer layer 16, the nitride-based semiconductor layer 18 or 20. However, the appearance location of the cracks or voids 22 depends on the process condition in the practical situations.

Referring to FIG. 1 again, the variable concentration of the group III element in the buffer layer 110 would reduce the curvature in the buffer layer 110 during the formation thereof, so as to avoid the nitride-based semiconductor layers 120 and 122 having cracks or voids.

Figure 3A:
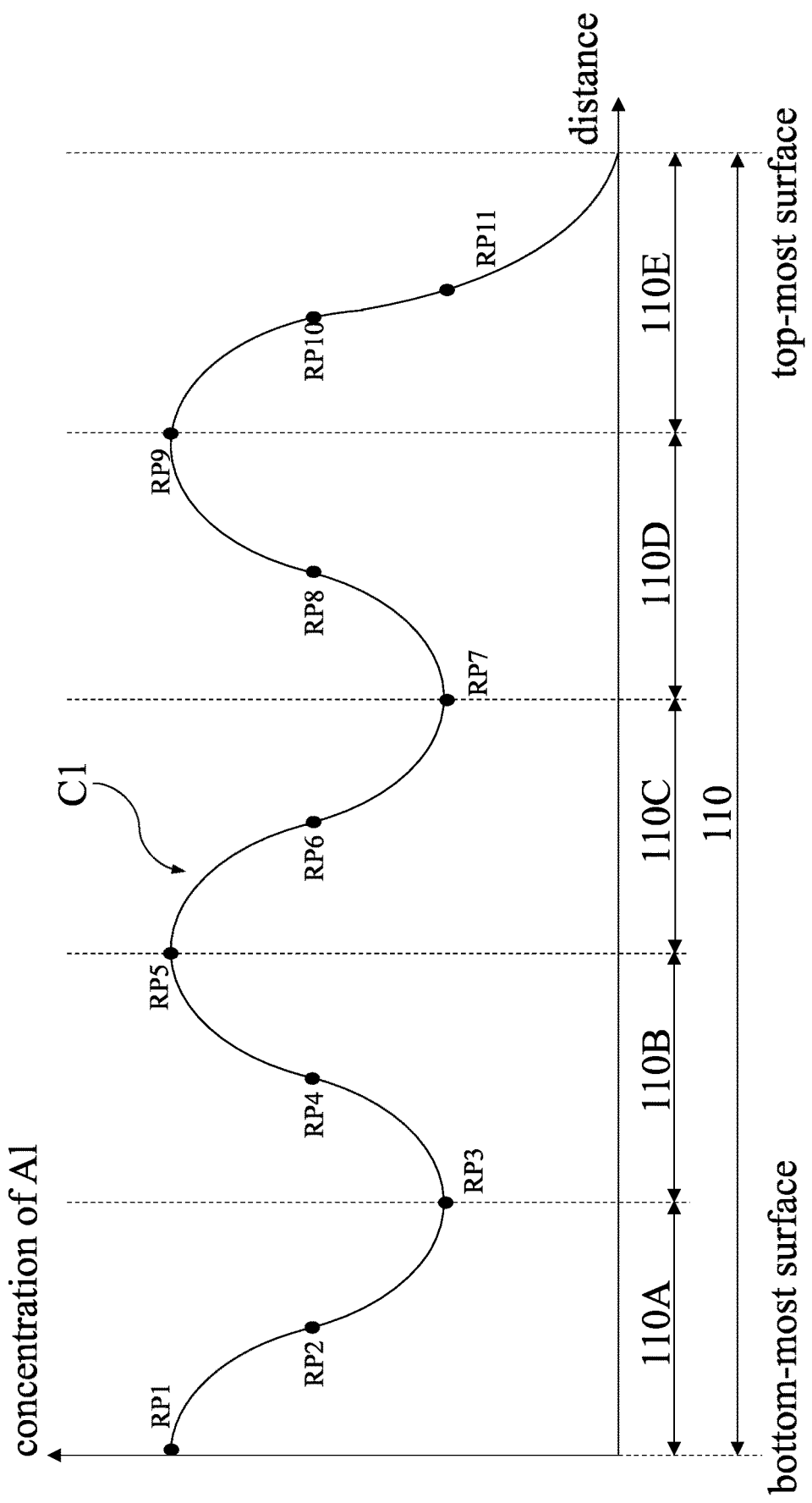
FIG. 3A is a graph showing the variable concentration of aluminum in the buffer layer versus a distance within a thickness of the buffer layer of FIG. 1 according to some embodiments of the present disclosure.

FIG. 3A is a graph showing the variable concentration of aluminum in the buffer layer 110 versus a distance within a thickness of the buffer layer 110 of FIG. 1 according to some embodiments of the present disclosure. In FIG. 3A, the distance can refer to a distance from a top surface of the nucleation layer 104, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 3A reflects a relationship curve C1 with labeled by reference points RP1, RP2, RP3, RP4, RP5, RP6, RP7, RP8, RP9, RP10, and RP11 for convenient reference. The reference points RP1-RP11 are positioned within a thickness of the buffer layer 110. The reference points RP1-RP11 are respectively positioned at different distances from a top surface of the nucleation layer 104 (i.e. from the bottom-most surface of the buffer layer 110). For example, the reference points RP1-RP11 are respectively positioned at distances, D1, D2, D3, D4, D5, D6, D7, D8, D9, D10, and D11 from the top surface of the nucleation layer 104 (i.e. from the bottom-most surface of the buffer layer 110), in which D1<D2<D3<D4<D5<D6<D7<D8<D9<D10<D11.

The variable concentration of aluminum of the buffer layer includes at least one incremental increase and at least one decremental decrease. Briefly, as shown in FIG. 3A, from the bottom-most surface toward the top-most surface of the buffer layer 110, the variable concentration of aluminum decrementally decreases, incrementally increases, decrementally decreases, and incrementally increases in sequence. These incremental increases and decremental decreases can be expressed as a function of the distance within a thickness of the buffer layer 110.

When a measurement to an aluminum concentration is performed on the buffer layer 110, the result would show "decremental decrease and then incremental increase" or "incremental increase and then decrementally decreases", which depends on an observation point. To illustrate, the following statements are provided with assuming that the reference points are taken as observation points during the measurement.

Under the concentration measurement of aluminum is performed with respect to the reference point RP1 along a direction away from the bottom-most surface of the buffer layer 110, the variable concentration of aluminum decrementally decreases and then incrementally increases. As shown in FIG. 3A, the concentration measurement of aluminum performed from the reference point RP1 through the reference points RP2, RP3, and RP4 would show the decremental decrease and then the incremental increase.

Under the concentration measurement of aluminum is performed with respect to the reference point RP2 along a direction away from the bottom-most surface of the buffer layer 110, the variable concentration of aluminum decrementally decreases and then incrementally increases. As shown in FIG. 3A, the concentration measurement of aluminum performed from the reference point RP2 through the reference points RP3 and RP4 would show the decremental decrease and then the incremental increase.

Under the concentration measurement of aluminum is performed with respect to the reference point RP4 along a direction away from the top-most surface of the buffer layer 110, the variable concentration of aluminum decrementally decreases and then incrementally increases. As shown in FIG. 3A, the concentration measurement of aluminum performed from the reference point RP4 through the reference points RP3 and RP2 would show the decremental decrease and then the incremental increase.

Under the concentration measurement of aluminum is performed with respect to the reference point RP5 along a direction away from the bottom-most surface of the buffer layer 110, the variable concentration of aluminum decrementally decreases and then incrementally increases. As shown in FIG. 3A, the concentration measurement of aluminum performed from the reference point RP5 through the reference points RP6, RP7, and RP8 would show the decremental decrease and then the incremental increase. Furthermore, under the concentration measurement of aluminum is performed with respect to the reference point RP5 along a direction away from the top-most surface of the buffer layer 110, the variable concentration of aluminum decrementally decreases and then incrementally increases. As shown in FIG. 3A, the concentration measurement of aluminum performed from the reference point RP5 through the reference points RP4, RP3, and RP2 would show the decremental decrease and then incremental increase.

Under the concentration measurement of aluminum is performed with respect to the reference point RP6 along a direction away from the bottom-most surface of the buffer layer 110, the variable concentration of aluminum decrementally decreases and then incrementally increases. As shown in FIG. 3A, the concentration measurement of aluminum performed from the reference point RP6 through the reference points RP7 and RP8 would show the decremental decrease and then the incremental increase.

Under the concentration measurement of aluminum is performed with respect to the reference point RP8 along a direction away from the top-most surface of the buffer layer 110, the variable concentration of aluminum decrementally decreases and then incrementally increases. As shown in FIG. 3A, the concentration measurement of aluminum performed from the reference point RP8 through the reference points RP7 and RP6 would show the decremental decrease and then the incremental increase.

Under the concentration measurement of aluminum is performed with respect to the reference point RP9 along a direction away from the top-most surface of the buffer layer 110, the variable concentration of aluminum decrementally decreases and then incrementally increases. As shown in FIG. 3A, the concentration measurement of aluminum performed from the reference point RP9 through the reference points RP8, RP7, and RP6 would show the decremental decrease and then incremental increase.

Moreover, with respect to some of the reference points, after decrementally decreasing and then incrementally increasing, the concentration of aluminum would further decrementally decreasing and then incrementally increasing again. For example, from the reference point RP1 to the reference point RP9, the decremental decrease, the incremental increase, the decremental decrease, and the incremental increase in sequence occur with respect to the reference point RP1. Similarly, from the reference point RP9 to the reference point RP1, the decremental decrease, the incremental increase, the decremental decrease, and the incremental increase in sequence occur with respect to the reference point RP9.

The measurement at different reference points may lead a different result.

Under the concentration measurement of aluminum is performed with respect to the reference point RP3 along a direction away from the bottom-most surface of the buffer layer 110, the variable concentration of aluminum incrementally increases and then decrementally decreases. As shown in FIG. 3A, the concentration measurement of aluminum performed from the reference point RP3 through the RP4, RP5, and RP4 would show the incremental increase and then the decremental decrease.

Under the concentration measurement of aluminum is performed with respect to the reference point RP4 along a direction away from the bottom-most surface of the buffer layer 110, the variable concentration of aluminum incrementally increases and then decrementally decreases. As shown in FIG. 3A, the concentration measurement of aluminum performed from the reference point RP4 through the RP5 and RP6 would show the incremental increase and then the decremental decrease.

Under the concentration measurement of aluminum is performed with respect to the reference point RP6 along a direction away from the top-most surface of the buffer layer 110, the variable concentration of aluminum incrementally increases and then decrementally decreases. As shown in FIG. 3A, the concentration measurement of aluminum performed from the reference point RP6 through the RP5 and RP4 would show the incremental increase and then the decremental decrease.

Under the concentration measurement of aluminum is performed with respect to the reference point RP7 along a direction away from the bottom-most surface of the buffer layer 110, the variable concentration of aluminum incrementally increases and then decrementally decreases. As shown in FIG. 3A, the concentration measurement of aluminum performed from the reference point RP7 through the reference points RP8, RP9, and RP10 would show the incremental increase and then the decremental decrease. Furthermore, under the concentration measurement of aluminum is performed with respect to the reference point RP7 along a direction away from the top-most surface of the buffer layer 110, the variable concentration of aluminum incrementally increases and then decrementally decreases. As shown in FIG. 3A, the concentration measurement of aluminum performed from the reference point RP7 through the reference points RP6, RP5, and RP4 would show the incremental increase and then the decremental decrease.

Under the concentration measurement of aluminum is performed with respect to the reference point RP8 along a direction away from the bottom-most surface of the buffer layer 110, the variable concentration of aluminum incrementally increases and then decrementally decreases. As shown in FIG. 3A, the concentration measurement of aluminum performed from the reference point RP8 through the RP9 and RP10 would show the incremental increase and then the decremental decrease.

Under the concentration measurement of aluminum is performed with respect to the reference point RP10 along a direction away from the top-most surface of the buffer layer 110, the variable concentration of aluminum incrementally increases and then decrementally decreases. As shown in FIG. 3A, the concentration measurement of aluminum performed from the reference point RP10 through the RP9 and RP8 would show the incremental increase and then the decremental decrease.

Under the concentration measurement of aluminum is performed with respect to the reference point RP11 along a direction away from the top-most surface of the buffer layer 110, the variable concentration of aluminum incrementally increases and then decrementally decreases. As shown in FIG. 3A, the concentration measurement of aluminum performed from the reference point RP11 through the RP9 and RP8 would show the incremental increase and then the decremental decrease.

Moreover, with respect to some of the reference points, after incrementally increasing and then decrementally decreasing, the concentration of aluminum would further incrementally increase and then decrementally decrease again. For example, from the reference point RP3 to the reference point RP11, the incremental increase, the decremental decrease, the incremental increase, and the decremental decrease in sequence occur with respect to the reference point RP3. Similarly, from the reference point RP11 to the reference point RP3, the incremental increase, the decremental decrease, the incremental increase, and the decremental decrease in sequence occur with respect to the reference point RP11.

Since there are more than one incremental increase and more than one decremental decrease, the relationship curve C1 representing the variable concentration of aluminum in the buffer layer 110 can have at least one part cyclically oscillating. This is, the measurement to the buffer layer 110 may show the variable concentration of aluminum has a cyclical oscillation feature. Herein, the term "cyclical oscillation" can mean the concentration of aluminum varies by alternatively increasing and decreasing in a range. The cyclical oscillation may include a regular variation or an irregular variation. Regarding the regular variation, a relationship curve between a concentration of aluminum and a distance within a thickness of the buffer layer 110 can be taken as a wave function with fixed period and amplitude. Regarding the irregular variation, the relationship curve between a concentration of aluminum and a distance within a thickness of the buffer layer 110 can be taken as a wave function with variable period and amplitude. The wave function can include, for example but are not limited to, sine wave, cosine wave, triangle wave, sawtooth wave, saw wave, step wave, and combinations thereof.

In the exemplary illustration of FIG. 3A, the relationship curve C1 has a part from reference points RP1 to RP11 taken as a sine/cosine wave with a regular variation. Accordingly, the part of the relationship curve C1 can be an oscillating curve/a cyclical curve changing periodically (i.e. a periodic curve).

With respect to the variable concentration of aluminum in the buffer layer 110, the cyclical oscillation can be found between two of the reference points or among more than two of the reference points.

With respect to the reference points RP1 and RP9, it can be measured that the concentration of aluminum is an cyclical oscillation. More specifically, in between the reference points RP1 and RP9, there are two periodic waves (one is from the reference point RP1 to the reference point RP5, and another one is from the reference point RP5 to the reference point RP9). The reference point RP5 can serve as a halfway point to the reference points RP1 and RP9. Due to the cyclical oscillation, the concentration of aluminum at the reference point RP5 can be the same as those at the reference points RP1 and RP9. In addition, as the reference points RP1 and RP9 are apexes of the sine/cosine wave and the reference point RP5 is the halfway point, the concentration of aluminum would decrementally decrease and then incrementally increase with respect to the reference point RP5. Furthermore, regarding the reference points RP2-RP4 and RP6-RP8, the concentrations of aluminum at these reference points are less than those at the reference points RP1 and RP9.

With respect to the reference points RP2 and RP10, it can be measured that the concentration of aluminum is an cyclical oscillation. More specifically, in between the reference points RP2 and RP10, there are two periodic waves (one is from the reference point RP2 to the reference point RP6, and another one is from the reference point RP6 to the reference point RP10). The reference point RP6 can serve as a halfway point to the reference points RP2 and RP10. The concentration of aluminum at the reference point RP6 can be the same as those at the reference points RP2 and RP10. In addition to the reference point RP6, the concentrations of aluminum at the reference points RP4 and RP8 can be the same as those at the reference points RP2 and RP10. Regarding the reference points RP1, RP5, and RP9, the concentrations of aluminum at these reference points are greater than those at the reference points RP2 and RP10. Regarding the reference points RP3, RP7, and RP11, the concentrations of aluminum at these reference points are less than those at the reference points RP2 and RP10.

With respect to the reference points RP3 and RP11, it can be measured that the concentration of aluminum is an cyclical oscillation. More specifically, in between the reference points RP3 and RP11, there are two periodic waves (one is from the reference point RP3 to the reference point RP7, and another one is from the reference point RP7 to the reference point RP11). The reference point RP7 can serve as a halfway point to the reference points RP3 and RP11. Due to the cyclical oscillation, the concentration of aluminum at the reference point RP7 can be the same as those at the reference points RP3 and RP11. In addition, as the reference point RP7 is the halfway point, the concentration of aluminum would decrementally decrease and then incrementally increase with respect to the reference point RP7. Furthermore, regarding the reference points RP1, RP2, RP4-RP6, and RP8-RP10, the concentrations of aluminum at these reference points are greater than those at the reference points RP3 and RP11.

Although the above exemplary cyclical oscillations are shown in between the two reference points having the same concentration of aluminum, the present disclosure is not limited to. For example, with respect to the reference points RP1 and RP11, in which the concentration of aluminum occurring at the reference point RP1 is greater than the concentration of aluminum occurring at the reference point RP11, the relationship curve C1 still has an cyclical oscillation therebetween. With respect to the reference points RP3 and RP9, in which the concentration of aluminum occurring at the reference point RP3 is less than the concentration of aluminum occurring at the reference point RP9, the relationship curve C1 still has an cyclical oscillation therebetween.

For any different three of the reference points RP1-RP11, it can be found that the concentration of aluminum occurring at the middle one would "incrementally increase and then decrementally decrease" or "decrementally decrease and then incrementally increase".

As being away from the reference point RP1 or toward the reference point RP7, the concentration of aluminum occurring at the reference point RP4 would incrementally increase and then decrementally decrease. As being toward the reference point RP1 or away from the reference point RP7, the concentration of aluminum occurring at the reference point RP4 would decrementally decrease and then incrementally increase. As being away from the reference point RP3 or toward the reference point RP9, the concentration of aluminum occurring at the reference point RP6 would decrementally decrease and then incrementally increase. As being toward the reference point RP3 or away from the reference point RP9, the concentration of aluminum occurring at the reference point RP6 would incrementally increase and then decrementally decrease.

Figure 3B:
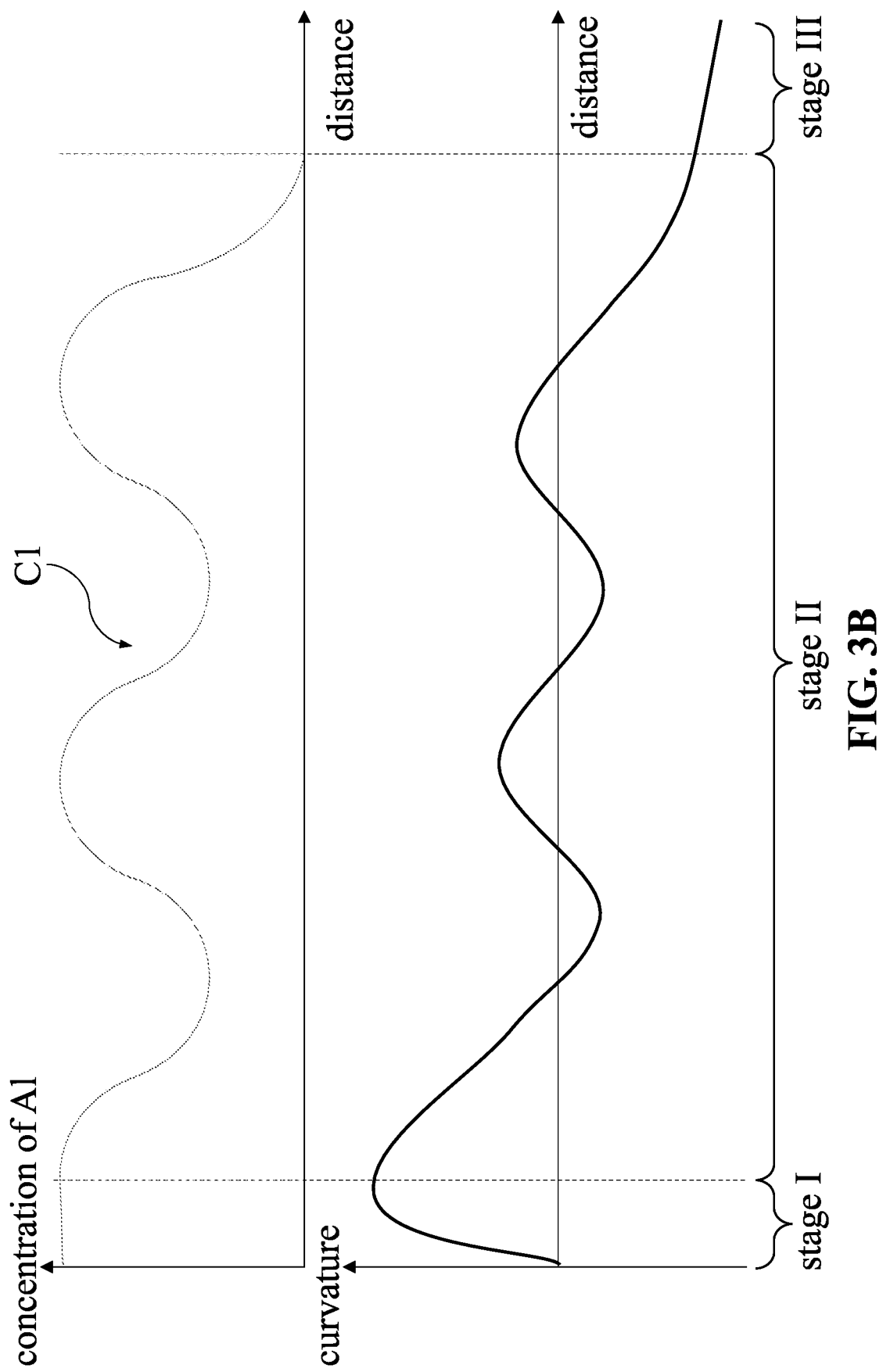
FIG. 3B is a graph showing curvature versus a distance within a thickness of the buffer layer 110 in FIG. 1 according to some embodiments of the present disclosure.

The variable concentration of aluminum in the buffer layer 110 is designed to avoid very positive curvature or very negative curvature occurring during the growth of the buffer layer 110. FIG. 3B is a graph showing curvature versus a distance within a thickness of the buffer layer 110 in FIG. 1 according to some embodiments of the present disclosure. The relationship curve C1 representing the variable concentration of aluminum in the buffer layer 110 in FIG. 3A is also putted in FIG. 3B for convenient reference. It should be noted that the curvature shown in FIG. 3B is exemplary and schematically reflects the trend of the curvature, and the absolute intensity may be varied due to the differences in the practical conditions (e.g. process conditions, measurement condition, or detection conditions).

As afore-mentioned, the trend of the curvature depends on whether the variable concentration increases or decreases. With the concentration of aluminum varying as "decrementally decreasing and then incrementally increasing" and "incrementally increasing and then decrementally decreasing", the curvature would be in variation correspondingly (i.e. the curvature would.

Referring to FIG. 3B, there are three stages I, II, and III, in which the stage I is the formation of the nucleation layer 104; the stage II is the formation of the buffer layer 110; and the stage III is the formation of the nitride-based semiconductor layer 120.

In the stage I, with the growth of the nucleation layer 104, the curvature increases due to accumulation of stress during the formation. In some embodiments, the growth of the nucleation layer 104 may be performed by a fixed or increasing aluminum concentration. In some embodiments, the growth of the nucleation layer 104 may be performed by an aluminum concentration varying in a slight range (relatively slight to the next stage).

In the stage II, the buffer layer 110 having the variable concentration of aluminum is formed, in which the variable concentration of aluminum can push the curvature in variation. More specifically, at the beginning of the growth of the buffer layer 110, since the concentration of aluminum decrementally decreases, the curvature changes as being in a negative trend. That is, the curvature may go from a positive state to a negative state. It may occur due to change of bending. Then, the concentration of aluminum is turned to incrementally increase, such that the trend of the curvature is turned as being positive. Such turning can make the curvature reduced. That is, with turning the trend of the curvature, it avoids that the negative curvature further becomes very negative. As the curvature is reduced, a layer to be formed on the buffer layer 110 (e.g. the nitride-based semiconductor layer 120) can have quality improved. It means the curvature can be controllable in a desired range. Herein, the desired range may refer to as being neither very positive nor very negative.

In the stage III, as growth of the nitride-based semiconductor layer 120, although the curvature continuously develops in the negative trend, the curvature after the stage II is neither very positive nor very negative such that the curvature after the growth of the nitride-based semiconductor layer 120 would not very positive or very negative as well. That is, the curvature after the growth of the nitride-based semiconductor layer 120 is acceptable for running the subsequent process (e.g. formation of the nitride-based semiconductor layer 122). Herein, the term "acceptable" may mean the quality of the nitride-based semiconductor layer 120 is improved (relatively to the comparative embodiment), such that occurrence of cracks or voids are reduced.

Referring to FIGS. 1 and 3A again. The buffer layer 110 having the variable concentration of aluminum can be formed by turning a process recipe during the formation thereof. As such, The single buffer layer 110 can have a plurality of sub-layers which have the same elements but different concentrations. That is, the sub-layers may have different percentage compositions. The "percentage composition" is a ratio of an amount of each element to the total amount of individual elements in a compound (i.e. proportionate number of atoms).

For example, the buffer layer 110 can have five sub-layers 110A, 110B, 110C, 110D, and 110E. The sub-layers 110A-110E are stacked sequentially from the nucleation layer 104. In some embodiments, a distinguishable interface exists between adjacent two of the sub-layers 110A-110E. The interfaces are parallel with the bottom-most surface of the buffer layer 110. In alternative embodiments, the adjacent two of the sub-layers 110A-110E may be merged and thus there is no distinguishable interface therebetween.

The buffer layer 110 including aluminum gallium nitride (AlGaN) can be formed by using deposition techniques. The deposition techniques can include, for example but are not limited to, atomic layer deposition (ALD), physical vapor deposition (PVD), chemical vapor deposition (CVD), metal organic CVD (MOCVD), epitaxial growth, or other suitable processes.

During a deposition process for the formation of the sub-layer 110A, aluminum, gallium, and nitrogen precursors are introduced into a gas flow in a chamber. An aluminum ratio (i.e. a ratio of the aluminum precursor to all precursors) correlates with an aluminum concentration of the formed sub-layer 110A. Accordingly, with gradually changing the aluminum ratio during the growth of the sub-layer 110A, the sub-layer 110A would be formed to have a variable concentration of aluminum.

Therefore, by decreasing the aluminum ratio over time during the growth of the sub-layer 110A, the sub-layer 110A would be formed to have concentration of aluminum that decrementally decreases as afore-described. After the growth of the sub-layer 110A, the formation of the sub-layer 110B is performed in situ. Similarly, by increasing the aluminum ratio over time during the growth of the sub-layer 110B, the sub-layer 110B would be formed to have concentration of aluminum that incrementally increases as afore-described.

In some embodiments, a change rate of the decreasing or increasing the aluminum ratio over time can be controlled. As such, a change rate of either the incremental increase or the decremental decrease of the variable concentration of aluminum would gradually vary. For example, with respect to the sub-layer 110A, the change rate of the decremental decrease of the variable concentration of aluminum gradually speeds up from the reference point RP1 to the reference point RP2 and then gradually slows down from the reference point RP2 to the reference point RP3. That is, as shown in the graph of the concentration of aluminum versus the distance within the thickness of the buffer layer, the oscillating curve has at least one part (e.g. the sub-layer 110A or other sub-layers 110B-110E) having a slope that gradually varies.

The similar approaches can be equivalently applied to the formation of the sub-layers 110C and 110D, such that the sub-layers 110C and 110D would be formed to have variable concentrations of aluminum. The sub-layer 110C is formed to have a concentration of aluminum that decrementally decreases as afore-described. The sub-layer 110C is formed to have a concentration of aluminum that incrementally increases as afore-described. Thereafter, the sub-layers 110E is formed to have a concentration of aluminum that decrementally decreases to about zero (i.e. exact zero or slightly greater than zero).

In some embodiments, decreasing the aluminum ratio can be achieved by decreasing quantity of the aluminum precursor. In some embodiments, decreasing the aluminum ratio can be achieved by increasing quantity of the gallium precursor. In some embodiments, decreasing the aluminum ratio can be achieved by increasing a gallium ratio (i.e. a ratio of the gallium precursor to all precursors). In some embodiments, decreasing the aluminum ratio can be achieved by decreasing a ratio of aluminum to gallium.

With respect to the buffer layer 110, since the variation of the concentration aluminum is caused by changing the aluminum ratio over time during the growth of the sub-layers 110A-110E, the relationship curve C1 of FIG. 3A is continuous. The incremental increase of the variable concentration of aluminum in the buffer layer 110 is continuous. The decremental decrease of the variable concentration of aluminum in the buffer layer 110 is continuous. Accordingly, when an incremental increase and then a decremental decrease occur, the end of the incremental increase and the beginning of the decremental decrease can be taken as the same point. Similarly, when a decremental decrease and then an incremental increase occur, the end of the decremental decrease and the beginning of the incremental increase can be taken as the same point. As such, the cyclical oscillation in the concentration of aluminum is continuous.

In some embodiments, the buffer layer 110 has a thickness over about 1 µm. The thickness of the buffer layer 110 may be varied of interest or can be changed based on the design requirements. For example, the semiconductor device 100 can be configured to work in a relatively low voltage condition (e.g., about 100V or less) in some embodiments, and the buffer layer 110 can have a thickness in a range from about 1 µm to about 2 µm. For example, the semiconductor device 100 can be configured to work in a relatively high voltage condition (e.g., over about 100V), and the buffer layer 110 can have a thickness over about 2 µm in some other embodiments. The buffer layer 110 which has relatively greater thickness can endure or withstand relatively greater breakdown voltage. The buffer layer 110 which has relatively greater thickness can endure or withstand relatively greater vertical breakdown voltage. The operating voltage or work voltage of the semiconductor device 100 can be positively correlated to the breakdown voltage of the buffer layer 110. The operating voltage or work voltage of the semiconductor device 100 can be positively correlated to the vertical breakdown voltage of the buffer layer 110. For example, the buffer layer 110 can have a thickness in a range from about 1 µm to about 2 µm to endure or withstand a breakdown voltage ranging from about 200V to about 500V in some other embodiments. For example, the buffer layer 110 can have a thickness in a range from about 1 µm to about 2 µm to endure or withstand a vertical breakdown voltage ranging from about 200V to about 500V in some other embodiments. For example, the buffer layer 110 can have a thickness in a range from about 4 µm to about 10 µm to endure or withstand a breakdown voltage up to about 400V to about 2500V in some other embodiments. For example, the buffer layer 110 can have a thickness in a range from about 4 µm to about 10 µm to endure or withstand a vertical breakdown voltage up to about 400V to about 2500V in some other embodiments. For example, the buffer layer 110 can have a thickness in a range from about 1 µm to about 50 µm to endure or withstand a breakdown voltage ranging from about 200V to about 12,500V in some other embodiments. For example, the buffer layer 110 can have a thickness in a range from about 1 µm to about 50 µm to endure or withstand a vertical breakdown voltage ranging from about 200V to about 12,500V in some other embodiments. For example, the buffer layer 110 can have a relatively great thickness as the voltage applied to the semiconductor device 100 goes up. In some other embodiments, the buffer layer 110 can have a thickness over about 50 µm to endure or withstand a breakdown voltage over about 12,500V.

In some embodiments, the sub-layers 110A to 110D have the same thickness. In some embodiments, the sub-layer 110E has a thickness greater than those of the sub-layer 110A to 110D. For a HEMT device, it is an important factor that if a buffer layer is thick enough. If a buffer layer has a thickness which is not as thick as enough, there would be a leakage current flowing to a bottom substrate. If a buffer layer has a thickness which is as thick as enough but does not have a variable concentration of aluminum as above, there would be a warpage issue occurring across the buffer layer or a layer to be formed on the buffer layer. In this regard, since the buffer layer 110 is formed to have the variable concentration of aluminum as above, the warpage issue is avoided and the buffer layer 110 has the thickness which can avoid occurrence of a leakage current.

Referring to FIG. 1 again, the gate structure 124 is disposed on the nitride-based semiconductor layer 122. The gate structure 124 may include a p-type doped III-V compound semiconductor layer 126 and a conductive gate 128. The conductive gate 128 can serve as a metal gate. The p-type doped III-V compound semiconductor layer 126 and the conductive gate 128 are stacked on the nitride-based semiconductor layer 122. The p-type doped III-V compound semiconductor layer 126 is between the nitride-based semiconductor layer 122 and the conductive gate 128. In some embodiments, the gate structure 124 may further include a dielectric layer (not illustrated) between the p-type doped III-V compound layer 126 and the conductive gate 128.

The semiconductor device 100 can be designed as being an enhancement mode device, which is in a normally-off state when the conductive gate 128 is at approximately zero bias. Specifically, the p-type doped III-V compound layer 126 creates a p-n junction with the nitride-based semiconductor layer 112 to deplete the 2DEG region, such that a zone of the 2DEG region corresponding to a position below the gate structure 124 has different characteristics (e.g. different electron concentrations) than the rest of the 2DEG region and thus is blocked. Due to such mechanism, the semiconductor device 100 has a normally-off characteristic. In other words, when no voltage is applied to the conductive gate 128 or a voltage applied to the conductive gate 128 is less than a threshold voltage (i.e. a minimum voltage required to form an inversion layer below the gate structure 124), the zone of the 2DEG region below the gate structure 124 is kept blocked, and thus no current flows therethrough. Moreover, by providing the p-type doped III-V compound semiconductor layer 126, gate leakage current is reduced and an increase in the threshold voltage during the off-state is achieved.

In some embodiments, the p-type doped III-V compound layer 122 can be omitted, such that the semiconductor device 100 is a depletion-mode device, which means the semiconductor device 100 in a normally-on state at zero gate-source voltage.

The exemplary materials of the p-type doped III-V compound layer 126 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd. In some embodiments, the nitride-based semiconductor layer 120 includes undoped GaN and the nitride-based semiconductor layer 122 includes AlGaN, and the p-type doped III-V compound layer 126 is a p-type GaN layer which can bend the underlying band structure upwards and to deplete the corresponding zone of the 2DEG region, so as to place the semiconductor device 100 into an off-state condition.

In some embodiments, the conductive gate 128 may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. In some embodiments, the exemplary materials of the conductive gate 128 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc), or combinations thereof.

The passivation layer 130 is disposed over the nitride-based semiconductor layer 122. The passivation layer 130 covers the gate structure 124 for a protection purpose. The passivation layer 130 is conformal with the gate structure 124 and thus has a projection profile over the gate structure 124. The exemplary materials of the passivation layer 130 can include, for example but are not limited to, $SiN_x$, $SiO_x$, SiON, SiC, SiBN, SiCBN, oxides, nitrides, or combinations thereof. In some embodiments, the passivation layer 130 is a multi-layered structure, such as a composite dielectric layer of $Al_2O_3$/SiN, $Al_2O_3$/$SiO_2$, AlN/SiN, AlN/$SiO_2$, or combinations thereof.

The S/D electrodes 132 and 134 are disposed on the nitride-based semiconductor layer 122. The S/D electrodes 122 and 124 are located at two opposite sides of the gate structure 124 (i.e. the gate structure 124 is located between the S/D electrodes 132 and 134). The gate structure 124 and the S/D electrodes 132 and 134 can collectively act as a GaN-based HEMT with the 2DEG region.

The S/D electrodes 132 and 134 have bottom portions penetrating the passivation layer 130 to form interfaces with the nitride-based semiconductor layer 122. The S/D electrodes 132 and 134 have top portions wider than the bottom portions thereof. The top portions of the S/D electrodes 132 and 134 extend over portions of the passivation layer 130.

In the exemplary illustration of FIG. 1, the left and right S/D electrodes 132 and 134 serve as source and drain electrodes, respectively. Although it is not shown in FIG. 1, the S/D electrodes 132 and 134 may be optionally asymmetrical about the gate structure 124. In some embodiments, the left S/D electrode 132 is closer to the gate structure 124 than the right S/D electrode 134. The present disclosure is not limited thereto, and the configuration of the S/D electrodes 132 and 134 is adjustable.

In some embodiments, each of the S/D electrodes 132 and 134 includes one or more conformal conductive layers. In some embodiments, the S/D electrodes 132 and 134 can include, for example but are not limited to, metals, alloys, doped semiconductor materials (such as doped crystalline silicon), other conductor materials, or combinations thereof. The exemplary materials of the S/D electrodes 132 and 134 can include, for example but are not limited to, Ti, AlSi, TiN, or combinations thereof. In some embodiments, each of the S/D electrodes 132 and 134 forms ohmic contact with the nitride-based semiconductor layer 122. The ohmic contact can be achieved by applying Ti, Al, or other suitable materials for the S/D electrodes 132 and 134. In some embodiments, a dielectric layer (not illustrated), such as SiN, can be disposed between the nitride-based semiconductor layer 122 and the S/D electrodes 132 and 134.

The passivation layer 136 is disposed above the passivation layer 130 and the S/D electrodes 132 and 134. The passivation layer 136 covers the GaN-based HEMT. The passivation layer 136 covers the S/D electrodes 122 and 124. The passivation layer 128 forms interfaces with sidewalls and top surfaces of the S/D electrodes 122 and 124. The passivation layer 136 may have a flat topmost surface, which is able to act as a flat base for carrying layers formed in a step subsequent to the formation thereof. The exemplary materials of the passivation layer 136 can include, for example but are not limited to, $SiN_x$, $SiO_x$, SiON, SiC, SiBN, SiCBN, oxides, nitrides, or combinations thereof. In some embodiments, the passivation layer 136 is a multi-layered structure, such as a composite dielectric layer of $Al_2O_3$/SiN, $Al_2O_3$/$SiO_2$, AlN/SiN, AlN/$SiO_2$, or combinations thereof.

The vias 138 penetrate the passivation layer 136 to connect to the gate structure 124 and the S/D electrodes 132 and 134. The vias 138 form interfaces with the gate structure 124 and the S/D electrodes 132 and 134. The exemplary materials of the vias 138 can include, for example but are not limited to, Cu, Al, or combinations thereof.

The patterned conductive layer 140 is disposed on the passivation layer 136. The patterned conductive layer 140 has a plurality of metal lines over the gate structure 124 and the S/D electrodes 132 and 134 for the purpose of implementing interconnects between circuits. The metal lines are in contact with the vias 138, respectively, such that the gate structure 124 and the S/D electrodes 132 and 134 can be arranged into a circuit. For example, the GaN-based HEMT can be electrically connected to other component(s) via the metal lines of the patterned conductive layer 140. In other embodiments, the patterned conductive layer 140 may include pads or traces for the same purpose.

In addition to changing the aluminum concentration as being variable, a concentration for other elements in the buffer layer may be variable as well. In this regard, since aluminum is a group III element, other group III concentration may be correspondingly fluctuated once the aluminum concentration increases or decreases. For example, due to the buffer layer including AlGaN, once the aluminum concentration increases or decreases, the concentration of gallium would increase or decrease.

Figure 4:
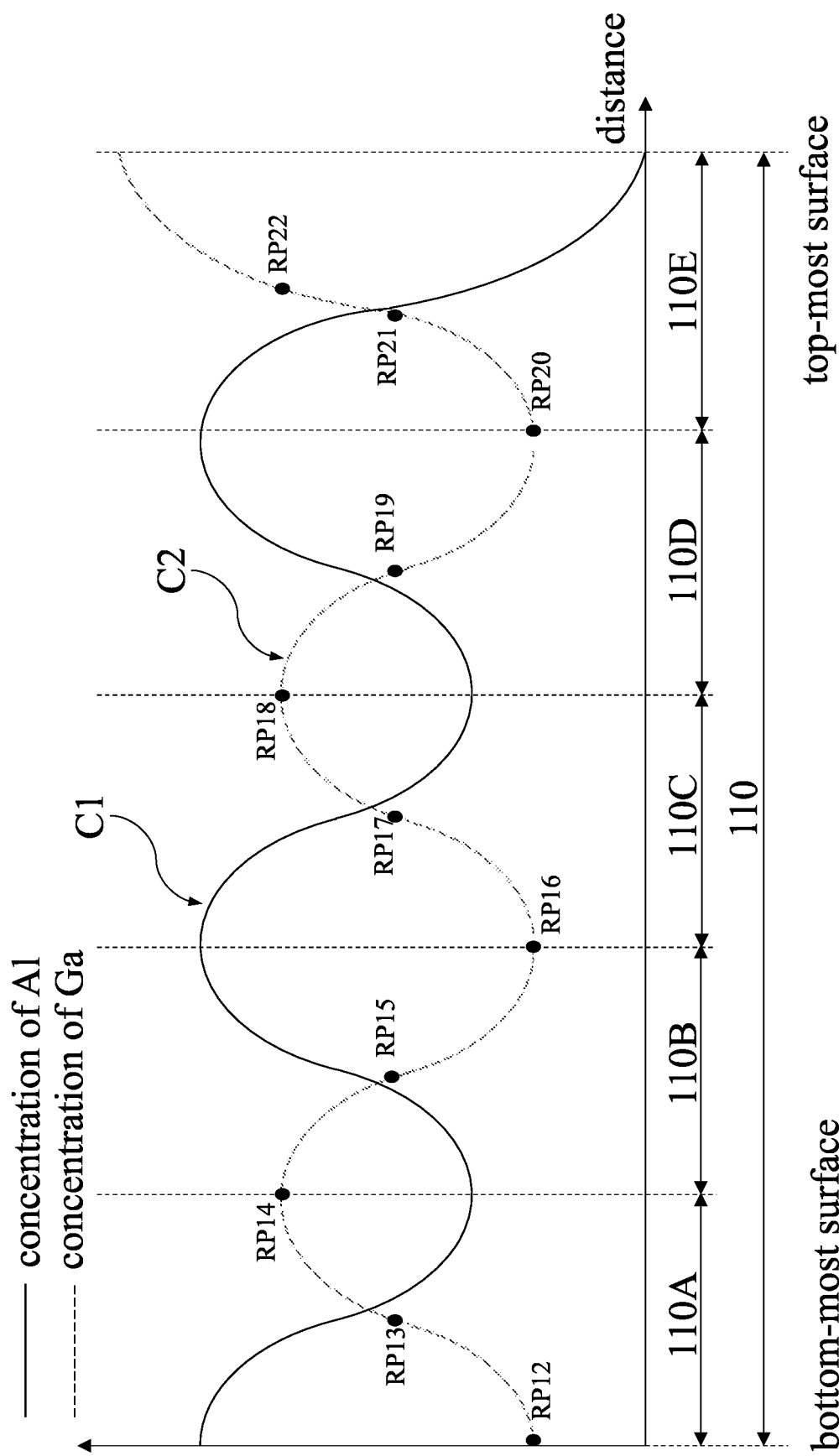
FIG. 4 is a graph showing a variable concentration of aluminum and gallium in a buffer layer versus a distance within a thickness thereof according to some embodiments of the present disclosure.

FIG. 4 is a graph showing a variable concentration of aluminum and gallium in a buffer layer 110 versus a distance within a thickness thereof according to some embodiments of the present disclosure. X-axis represents a distance from a bottom-most surface of the buffer layer 110, and is in an arbitrary unit. The bottom-most surface and the top-most surface of the buffer layer 110 are labeled on the corresponding locations at X-axis for convenient reference. Y-axis represents concentration values for aluminum and gallium, in which the solid line represents aluminum and the dot line represents gallium, where the unit is "%."

The graph of FIG. 4 reflects relationship curves C1 and C2 for aluminum and gallium, respectively. The description with respect to the relationship curve C1 has been provided above. The illustration of the relationship curve C1 is made for comparing with the relationship curve C2. The relationship curve C2 is made with labeled by reference points, RP12, RP13, RP14, RP15, RP16, RP17, RP18, RP19, RP20, RP21, and RP22 for convenient reference. The reference points RP12-RP22 are positioned within a thickness of the buffer layer 110, which are identical or similar to the reference points RP1-RP11, respectively.

The variable concentration of gallium of the buffer layer 110 includes at least one incremental increase and at least one decremental decrease corresponding to the fluctuation of the variable concentration of aluminum. Similarly, these incremental increases and decremental decreases can be expressed as a function of the distance within a thickness of the buffer layer 110. When a measurement to a gallium concentration is performed on the buffer layer 110, the result would show "decremental decrease and then incremental increase" or "incremental increase and then decrementally decreases", which depends on an observation point. To illustrate, the following statements are provided with assuming that the reference points are taken as observation points during the measurement.

With respect to the reference points RP12, RP13, RP16, or RP17, as the concentration measurement of gallium is performed from these reference points along a direction away from the bottom-most surface of the buffer layer 110, the variable concentration of gallium incrementally increases and then decrementally decreases. Such trend may be contrary to that of the variable concentration of gallium. For example, with respect to the reference point RP12, the variable concentration of gallium incrementally increases and then decrementally decreases, while the variable concentration of aluminum decrementally decreases and then incrementally increases, along a direction away from the bottom-most surface of the buffer layer 110.

With respect to the reference points RP15, RP16, RP19, or RP20, as the concentration measurement of gallium is performed from these reference points along a direction away from the top-most surface of the buffer layer 110, the variable concentration of gallium incrementally increases and then decrementally decreases.

With respect to the reference points RP14, RP15, RP18, or RP19, as the concentration measurement of gallium is performed from these reference points along a direction away from the bottom-most surface of the buffer layer 110, the variable concentration of gallium decrementally decreases and then incrementally increases.

With respect to the reference points RP17, RP18, RP21, or RP22, as the concentration measurement of gallium is performed from these reference points along a direction away from the top-most surface of the buffer layer 110, the variable concentration of gallium decrementally decreases and then incrementally increases.

Such trend may be contrary to that of the variable concentration of aluminum. For example, with respect to the reference point RP13, the variable concentration of gallium incrementally increases and then decrementally decreases along a direction away from the bottom-most surface of the buffer layer 110, while the variable concentration of aluminum decrementally decreases and then incrementally increases along a direction away from the bottom-most surface of the buffer layer 110. The turning point from the incremental increase to the decremental decrease in the variable concentration of gallium appears at a location/position the same as or near the turning point from the decremental decrease to the incremental increase in the variable concentration of aluminum.

With respect to some of the reference points, after incrementally increasing and then decrementally decreasing, the concentration of gallium would further incrementally increase and then decrementally decrease again. For example, from the reference point RP12 to the reference point RP20, the incremental increase, the decremental decrease, the incremental increase, and the decremental decrease in sequence occur with respect to the reference point RP12.

Similarly, with respect to some of the reference points, after decrementally decreasing and then incrementally increasing, the concentration of gallium would further decrementally decrease and then incrementally increase again. For example, from the reference point RP14 to the reference point RP22, the decremental decrease, the incremental increase, the decremental decrease, and the incremental increase in sequence occur with respect to the reference point RP14.

The relationship curve C2 representing the variable concentration of gallium in the buffer layer 110 can have at least one part cyclically oscillating. As previously described, the cyclical oscillation may include a regular variation or an irregular variation. Regarding the regular variation, a relationship curve between a concentration of gallium and a distance within a thickness of the buffer layer 110 can be taken as a wave function with fixed period and amplitude. Regarding the irregular variation, the relationship curve between a concentration of gallium and a distance within a thickness of the buffer layer 110 can be taken as a wave function with variable period and amplitude. The wave function can include, for example but are not limited to, sine wave, cosine wave, triangle wave, sawtooth wave, saw wave, step wave, and combinations thereof.

In the exemplary illustration of FIG. 4, the relationship curve C2 has a part from reference points RP12 to RP22 taken as a sine/cosine wave with a regular variation. Accordingly, the part of the relationship curve C2 can be an oscillating curve/a cyclical curve changing periodically (i.e. a periodic curve).

With respect to the variable concentration of gallium in the buffer layer 110, the cyclical oscillation can be found between two of the reference points or among more than two of the reference points. For any different three of the reference points RP12-RP22, it can be found that the concentration of gallium occurring at the middle one would "incrementally increase and then decrementally decrease" or "decrementally decrease and then incrementally increase". Such characterization can be identical or similar to the variable concentration of aluminum.

The buffer layer 110 can be formed to have the sub-layers 110A-110E, as afore-described. Similarly, when the decreasing or increasing the aluminum ratio over time is controlled such that a change rate of either the incremental increase or the decremental decrease of the variable concentration of gallium gradually varies, a change rate of either the incremental increase or the decremental decrease of the variable concentration of gallium gradually varies as well. For example, with respect to the sub-layer 110A, the change rate of the incremental increase of the variable concentration of gallium gradually speeds up from PR12 to PR13 and then gradually slows down from PR13 to RP14.

The relationship curve C2 of FIG. 4 is continuous. The incremental increase of the variable concentration of gallium in the buffer layer 110 is continuous. The decremental decrease of the variable concentration of gallium in the buffer layer 110 is continuous. The connection from the incremental increase to the decremental decrease (or from the decremental decrease to the incremental increase) is continuous. As such, the cyclical oscillation in the concentration of gallium is continuous.

Once the measurement is performed for obtaining other property, such as lattice constant/number, it can be found such property would vary along the thickness of the buffer layer. The lattice constant/number can vary along the thickness of the buffer layer due to the variation of an element ratio of a group III element to another group III element. In some embodiments, the variation of the element ratio is resulted from the variations of aluminum and gallium. For example, in a path along the thickness of the buffer layer, aluminum may decrementally decrease and gallium may incrementally increase. In other embodiments, the variation of the element ratio is resulted from variations of two different group III elements (i.e. one decrementally decreases and another one incrementally increases). That is, the element ratio changes due to both concentrations of the different group III elements vary, and the variation of the concentration of one group III element negatively correlates with the variation of the concentration of another one III element. The element ratio may incrementally increase and then decrementally decrease (or decrementally decrease and then incrementally increase) as a function of a distance within a thickness of the buffer layer such that the buffer layer has a variable lattice constant/number in accordance with change of the element ratio.

Figure 5:
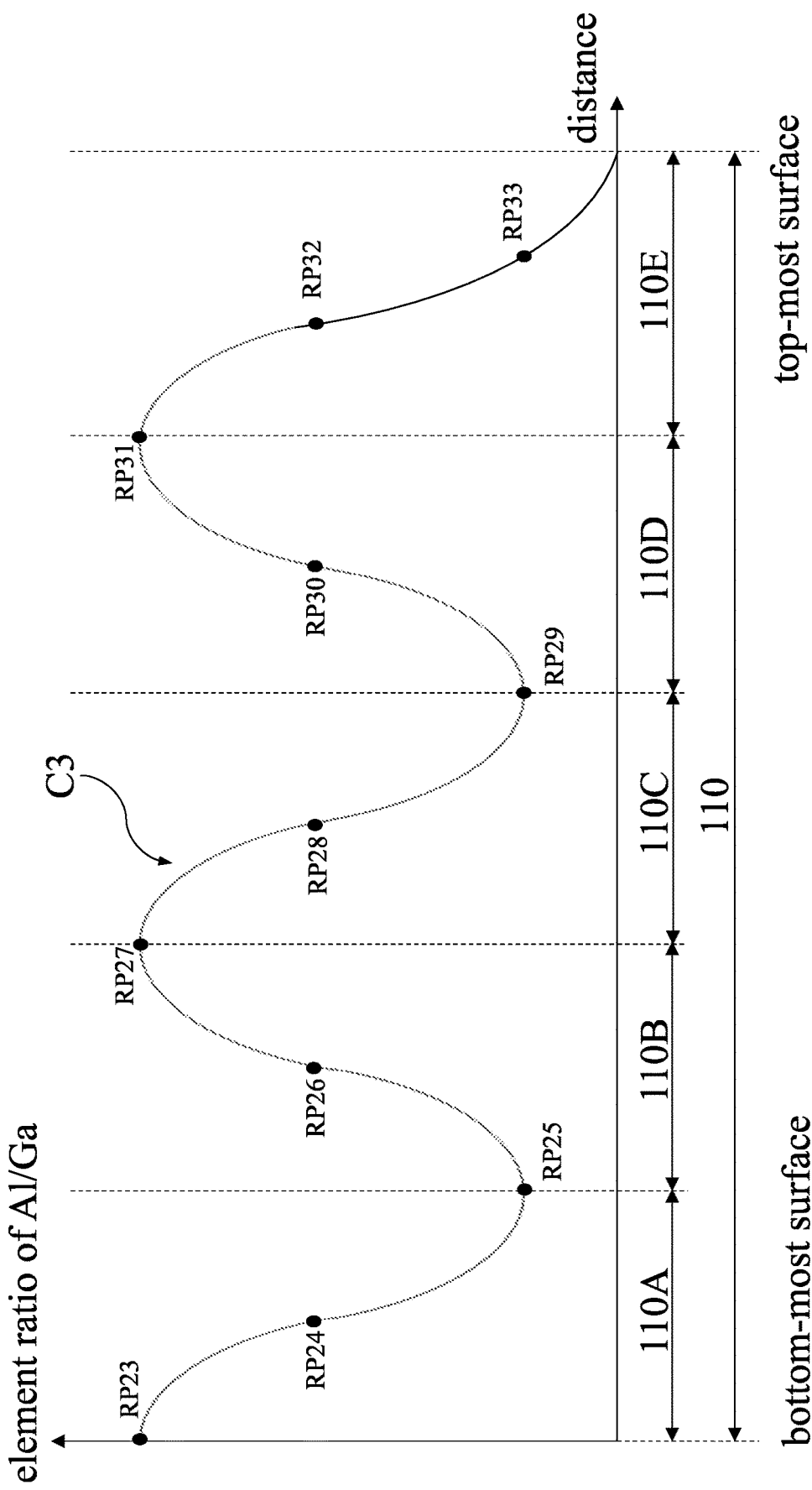
FIG. 5 is a graph showing an element ratio of aluminum to gallium in a buffer layer versus a distance within a thickness thereof according to some embodiments of the present disclosure.

More specifically, FIG. 5 is a graph showing an element ratio of aluminum to gallium in a buffer layer 110 versus a distance within a thickness thereof according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the element ratio, where the unit is "%."

The graph of FIG. 5 reflects a relationship curve C3 for an element ratio of aluminum to gallium. The relationship curve C3 is made with labeled by reference points, RP23, RP24, RP25, RP26, RP27, RP28, RP29, RP30, RP31, RP32, and RP33 for convenient reference. The reference points RP23-RP33 are positioned within a thickness of the buffer layer 110, which are identical or similar to the reference points RP1-RP11, respectively.

The element ratio of aluminum to gallium in the buffer layer 110 is variable and includes at least one incremental increase and at least one decremental decrease. These incremental increases and decremental decreases can be expressed as a function of the distance within a thickness of the buffer layer 110. When a measurement to find the element ratio of aluminum to gallium in the buffer layer 110 is performed, the result would show "decremental decrease and then incremental increase" or "incremental increase and then decrementally decreases", which depends on an observation point. To illustrate, the following statements are provided with assuming that the reference points are taken as observation points during the measurement.

With respect to the reference points RP23, RP24, RP27, or RP28, as the measurement of the element ratio is performed from the reference point along a direction away from the bottom-most surface of the buffer layer 110, the element ratio decrementally decreases and then incrementally increases.

With respect to the reference points RP26, RP27, RP30, or RP31, as the measurement of the element ratio is performed from the reference point along a direction away from the top-most surface of the buffer layer 110, the element ratio decrementally decreases and then incrementally increases.

With respect to the reference points RP25, RP26, RP29, or RP30, as the measurement of the element ratio is performed from the reference point along a direction away from the bottom-most surface of the buffer layer 110, the element ratio incrementally increases and then decrementally decreases.

With respect to the reference points RP28, RP29, RP32, or RP33, as the measurement of the element ratio is performed from the reference point along a direction away from the top-most surface of the buffer layer 110, the element ratio incrementally increases and then decrementally decreases.

Such trend may be identical or similar to that of the variable concentration of aluminum. The trend shows a fluctuation in the element ratio, and thus the lattice constant/number would fluctuate correspondingly.

With respect to some of the reference points, after decrementally decreasing and then incrementally increasing, the element ratio would further decrementally decrease and then incrementally increase again. For example, from the reference point RP23 to the reference point RP31, the decremental decrease, the incremental increase, the decremental decrease, and the incremental increase in sequence occur with respect to the reference point RP23.

Similarly, with respect to some of the reference points, after incrementally increasing and then decrementally decreasing, the element ratio would further incrementally increase and then decrementally decrease again. For example, from the reference point RP25 to the reference point RP33, the incremental increase, the decremental decrease, the incremental increase, and the decremental decrease in sequence occur with respect to the reference point RP25.

The relationship curve C3 representing the variable concentration of gallium in the buffer layer 110 can have at least one part cyclically oscillating. As afore-mentioned, the cyclical oscillation may include a regular variation or an irregular variation. Regarding the regular variation, the relationship curve C3 can serve as a wave function with fixed period and amplitude. Regarding the irregular variation, the relationship curve C3 can serve as a wave function with variable period and amplitude. The wave function can include, for example but are not limited to, sine wave, cosine wave, triangle wave, sawtooth wave, saw wave, step wave, and combinations thereof.

In the exemplary illustration of FIG. 5, the relationship curve C3 has a part from reference points RP23 to RP31 taken as a sine/cosine wave with a regular variation. Accordingly, the part of the relationship curve C3 can be an oscillating curve/a cyclical curve changing periodically (i.e. a periodic curve).

With respect to the variable element ratio in the buffer layer 110, the cyclical oscillation can be found between two of the reference points RP23-RP33 or among more than two of the reference points RP23-RP33. Furthermore, for any different three of the reference points RP23-RP33, it can be found that the element ratio occurring at the middle one would "incrementally increase and then decrementally decrease" or "decrementally decrease and then incrementally increase". Such characterization can be identical or similar to the variable concentration of aluminum.

The buffer layer 110 can be formed to have the sublayers 110A-110E, as afore-described. Similarly, during the formation of the buffer layer 110, when the decreasing or increasing the aluminum ratio over time is controlled such that a change rate of either the incremental increase or the decremental decrease of the element ratio gradually varies, a change rate of either the incremental increase or the decremental decrease of the element ratio gradually varies as well. For example, with respect to the sub-layer 110A, the change rate of the decremental decrease gradually speeds up from PR23 to PR24 and then gradually slows down from PR24 to RP25.

The relationship curve C3 of FIG. 5 is continuous. The incremental increase of the variable element ratio in the buffer layer 110 is continuous. The decremental decrease of the variable element ratio in the buffer layer 110 is continuous. The connection from the incremental increase to the decremental decrease (or from the decremental decrease to the incremental increase) is continuous. As such, the cyclical oscillation in the element ratio is continuous.

Furthermore, the buffer layer can be formed by different manners or with different recipes, so as to have different relationship curves of the variable concentration of aluminum, the variable concentration of gallium, and the element ratio of aluminum to gallium than those as afore-mentioned.

Figure 6:
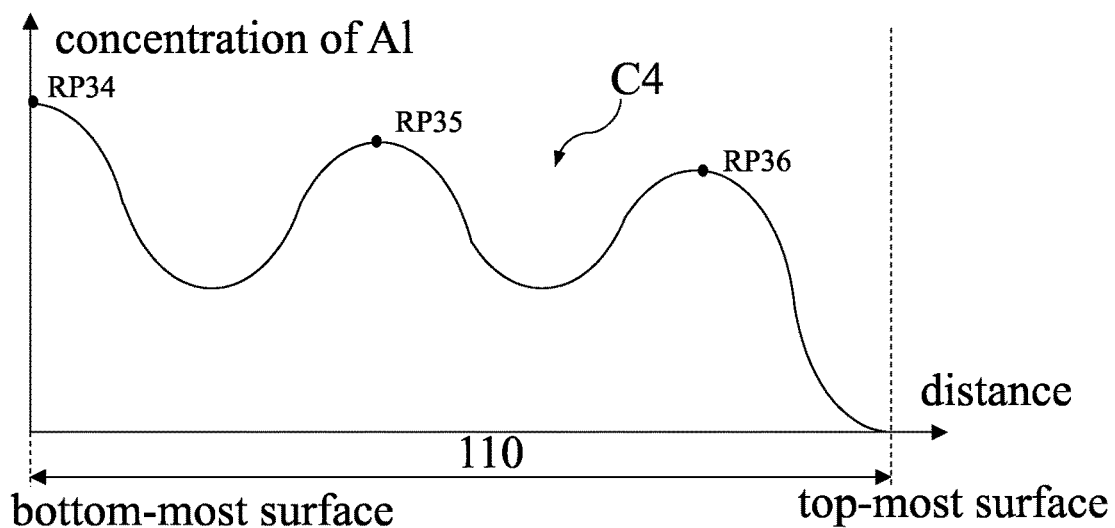
FIG. 6 is a graph showing a variable concentration of aluminum in a buffer layer versus a distance within a thickness of the same according to some embodiments of the present disclosure.

FIG. 6 is a graph showing a variable concentration of aluminum in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 6 reflects a relationship curve C4 for a variable concentration of aluminum in the buffer layer 110. To illustrate, reference points RP34, RP35, and RP36 are labeled on the relationship curve C4 for convenient reference, in which the reference points RP34-RP36 are positioned within a thickness of the buffer layer 110. In the exemplary illustration of FIG. 6, the relationship curve C4 has continuous incremental increases and decremental decreases and a change rate of them varies, such that at least one part of the relationship curve C4 can be an oscillating curve/a cyclical curve changing periodically (i.e. a periodic curve).

In particular, a maximum concentration of aluminum with each period successively changes. More specifically, there are three maximum concentrations of aluminum in the relationship curve C4, which are positioned at reference points RP34, RP35, and RP36. That is, as the distance from the bottom-most surface of the buffer layer gets farther, the maximum concentrations become less correspondingly. Although the maximum concentrations become less, the trend of the variable concentration of aluminum still varies in fluctuation (i.e. getting up and down repeatedly) and thus it can be called a periodic curve.

Figure 7:
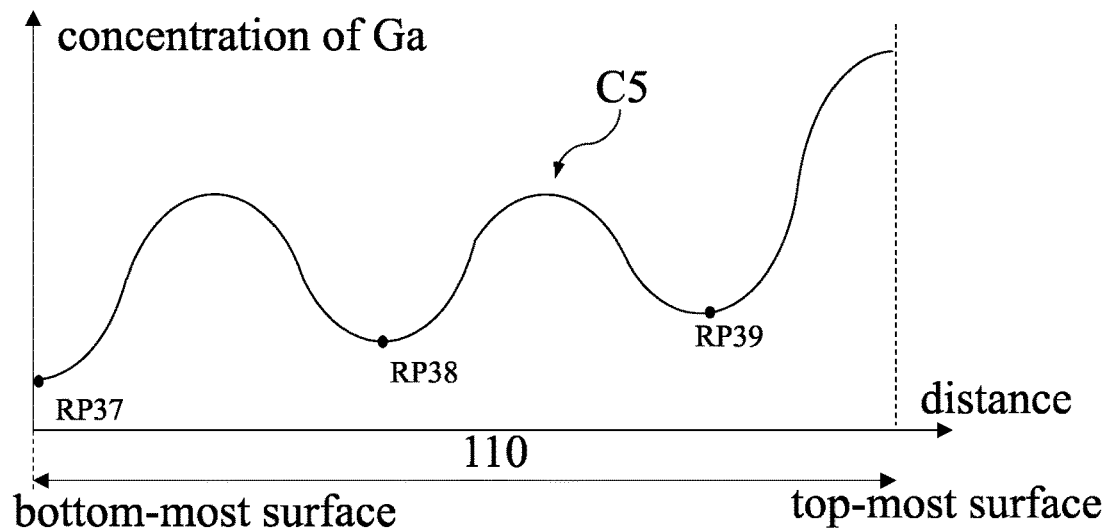
FIG. 7 is a graph showing a variable concentration of gallium in a buffer layer versus a distance within a thickness of the same according to some embodiments of the present disclosure.

FIG. 7 is a graph showing a variable concentration of gallium in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 7 reflects a relationship curve C5 for a variable concentration of gallium in the buffer layer 110. To illustrate, reference points RP37, RP38, and RP39 are labeled on the relationship curve C5 for convenient reference, in which the reference points RP37-RP39 are positioned within a thickness of the buffer layer 110. In the exemplary illustration of FIG. 7, the relationship curve C5 has continuous incremental increases and decremental decreases and a change rate of them varies, such that at least one part of the relationship curve C5 can be an oscillating curve/a cyclical curve changing periodically (i.e. a periodic curve).

As afore-described, since the trend of the variable concentration of gallium would be contrary to that of the variable concentration of aluminum, the minimum concentration of gallium with each period would successively change, corresponding to the maximum concentration of aluminum with each period successively changing. More specifically, there are three minimum concentrations of gallium in the relationship curve C5, which are positioned at reference points RP37, RP38, and RP39. That is, as the distance from the bottom-most surface of the buffer layer gets farther, the minimum concentrations become greater correspondingly. Although the minimum concentrations become greater, the trend of the variable concentration of gallium still varies in fluctuation (i.e. getting up and down repeatedly) and thus it can be called a periodic curve.

Figure 8:
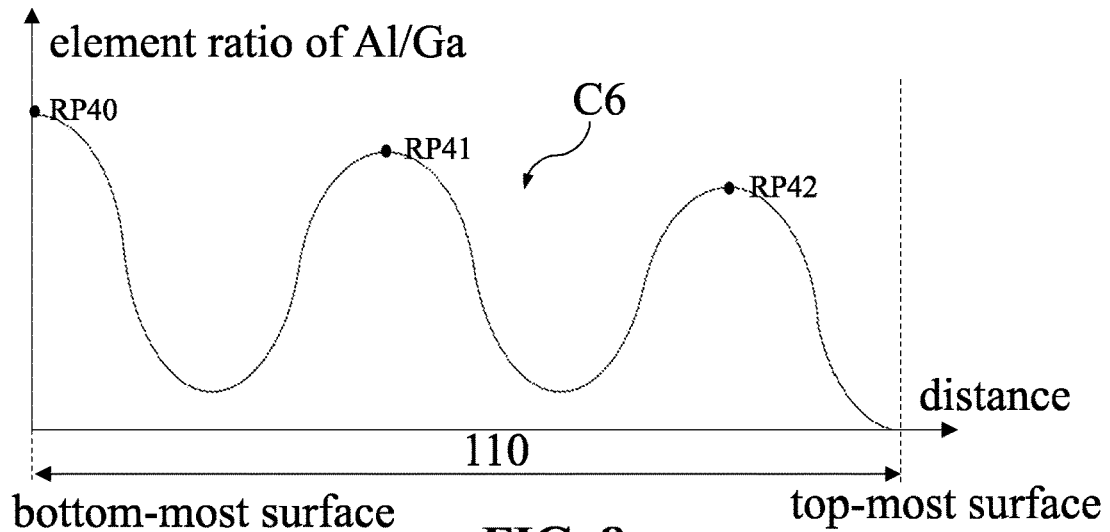
FIG. 8 is a graph showing an element ratio of aluminum to gallium in a buffer layer versus a distance within a thickness of the same according to some embodiments of the present disclosure.

FIG. 8 is a graph showing an element ratio of aluminum to gallium in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 8 reflects a relationship curve C6 for an element ratio of aluminum to gallium in the buffer layer 110. To illustrate, reference points RP40, RP41, and RP42 are labeled on the relationship curve C6 for convenient reference, in which the reference points RP40-RP42 are positioned within a thickness of the buffer layer 110. In the exemplary illustration of FIG. 8, the relationship curve C6 has continuous incremental increases and decremental decreases and a change rate of them varies, such that at least one part of the relationship curve C6 can be an oscillating curve/a cyclical curve changing periodically (i.e. a periodic curve).

As afore-described, the element ratio of aluminum to gallium changes corresponding to the variations of the concentrations of the two different group III elements, and it would have the trend similar to that of the variation of the concentration of aluminum. Accordingly, a maximum value of the element ratio with each period successively changes. More specifically, there are three maximum values of the element ratio in the relationship curve C6, which are positioned at reference points RP40, RP41, and RP 42. That is, as the distance from the bottom-most surface of the buffer layer gets farther, the maximum values of the element ratio become less correspondingly. Although the maximum values of the element ratio become less, the trend of the element ratio still varies in fluctuation (i.e. getting up and down repeatedly) and thus it can be called a periodic curve.

Figure 9:
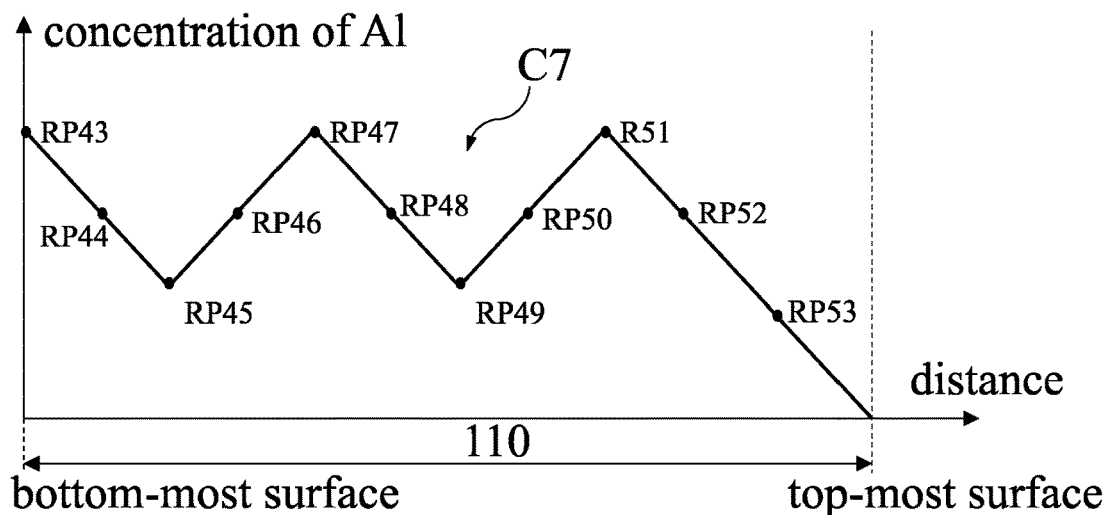
FIG. 9 is a graph showing a variable concentration of aluminum in a buffer layer versus a distance within a thickness of the same according to some embodiments of the present disclosure.

FIG. 9 is a graph showing a variable concentration of aluminum in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 9 reflects a relationship curve C7 for a variable concentration of aluminum in the buffer layer 110. To illustrate, reference points RP43, RP44, RP45, RP46, RP47, RP48, RP49, RP50, RP51, RP52, and RP53 are labeled on the relationship curve C7 for convenient reference, in which the reference points RP43-RP52 are positioned within a thickness of the buffer layer 110.

In the exemplary illustration of FIG. 9, the relationship curve C7 has continuous incremental increases and decremental decreases. Regarding a change rate of the continuous incremental increases and decremental decreases, it would be constant. For example, the change rate of the decremental decrease (decrease degree per distance) from the reference point RP43 to the reference point RP44 is the same as that of the decremental decrease from the reference point RP44 to the reference point RP45. The relationship curve C7 still goes up and down repeatedly, such that at least one part of the relationship curve C7 can be an oscillating curve/a cyclical curve changing periodically (i.e. a periodic curve). Such oscillating curve/cyclical curve would have a slope in constant, because the change rate of the incremental increases or the decremental decrease is constant. That is, the relationship curve C7 can be a wave function, such as triangular wave, triangle wave, or other waves in non-sinusoidal waveforms.

With respect to the reference points RP43, RP44, RP47, or RP48, as the measurement of the variable concentration of aluminum is performed from the reference point along a direction away from the bottom-most surface of the buffer layer 110, the variable concentration of aluminum decrementally decreases and then incrementally increases.

With respect to the reference points RP46, RP47, RP50, or RP51, as the measurement of the variable concentration of aluminum is performed from the reference point along a direction away from the top-most surface of the buffer layer 110, the variable concentration of aluminum decrementally decreases and then incrementally increases.

With respect to the reference points RP45, RP46, RP49, or RP50, as the measurement of the variable concentration of aluminum is performed from the reference point along a direction away from the bottom-most surface of the buffer layer 110, the variable concentration of aluminum incrementally increases and then decrementally decreases.

With respect to the reference points RP48, RP49, RP52, or RP53, as the measurement of the variable concentration of aluminum is performed from the reference point along a direction away from the top-most surface of the buffer layer 110, the variable concentration of aluminum incrementally increases and then decrementally decreases.

With respect to some of the reference points, after decrementally decreasing and then incrementally increasing, the variable concentration of aluminum would further decrementally decrease and then incrementally increase again. For example, from the reference point RP43 to RP51, the decremental decrease, the incremental increase, the decremental decrease, and the incremental increase in sequence occur with respect to the reference point RP43.

Similarly, with respect to some of the reference points, after incrementally increasing and then decrementally decreasing, the variable concentration of aluminum would further incrementally increase and then decrementally decrease again. For example, from the reference point RP45 to RP53, the incremental increase, the decremental decrease, the incremental increase, and the decremental decrease in sequence occur with respect to the reference point RP45.

With respect to the variable concentration of aluminum in the buffer layer 110, the cyclical oscillation can be found between two of the reference points RP43-RP53 or among more than two of the reference points RP43-RP53. Furthermore, for any different three of the reference points RP43-RP53, it can be found that the variable concentration of aluminum occurring at the middle one would "incrementally increase and then decrementally decrease" or "decrementally decrease and then incrementally increase". Such characterization can be identical or similar to the variable concentration of aluminum.

Figure 10:
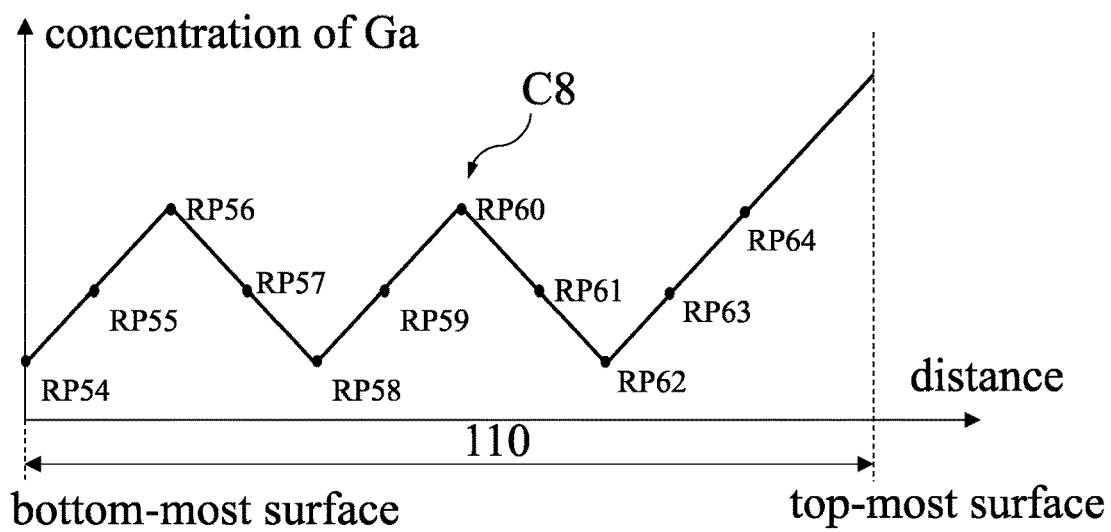
FIG. 10 is a graph showing a variable concentration of gallium in a buffer layer versus a distance within a thickness of the same according to some embodiments of the present disclosure.

FIG. 10 is a graph showing a variable concentration of gallium in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 10 reflects a relationship curve C8 for a variable concentration of gallium in the buffer layer 110. To illustrate, reference points RP54, RP55, RP56, RP57, RP58, RP59, RP60, RP61, RP62, RP63, and RP64 are labeled on the relationship curve C8 for convenient reference, in which the reference points RP54-RP64 are positioned within a thickness of the buffer layer 110.

In the exemplary illustration of FIG. 10, the relationship curve C8 has continuous incremental increases and decremental decreases. Similarly, regarding a change rate of the continuous incremental increases and decremental decreases, it would be constant. For example, the change rate of the incremental increase (increase degree per distance) from the reference point RP54 to the reference point RP55 is the same as that of the decremental decrease from the reference point RP55 to the reference point RP56. The relationship curve C8 still goes up and down repeatedly, such that at least one part of the relationship curve C8 can be an oscillating curve/a cyclical curve changing periodically (i.e. a periodic curve). Such oscillating curve/cyclical curve would have a slope in constant, because the change rate of the incremental increases or the decremental decrease is constant. That is, the relationship curve C8 can be a wave function, such as triangular wave, triangle wave, or other waves in non-sinusoidal waveforms.

As afore-described, the trend of the variable concentration of gallium would be contrary to that of the variable concentration of aluminum (i.e. be contrary to the trend illustrated in FIG. 9).

With respect to the reference points RP54, RP55, RP58, or RP59, as the measurement of the variable concentration of gallium is performed from the reference point along a direction away from the bottom-most surface of the buffer layer 110, the variable concentration of gallium incrementally increases and then decrementally decreases.

With respect to the reference points RP57, RP58, RP61, or RP62, as the measurement of the variable concentration of gallium is performed from the reference point along a direction away from the top-most surface of the buffer layer 110, the variable concentration of gallium incrementally increases and then decrementally decreases.

With respect to the reference points RP56, RP57, RP60, or RP61, as the measurement of the variable concentration of gallium is performed from the reference point along a direction away from the bottom-most surface of the buffer layer 110, the variable concentration of gallium decrementally decreases and then incrementally increases.

With respect to the reference points RP59, RP60, RP63, or RP64, as the measurement of the variable concentration of gallium is performed from the reference point along a direction away from the top-most surface of the buffer layer 110, the variable concentration of gallium decrementally decreases and then incrementally increases.

With respect to some of the reference points, after incrementally increasing and then decrementally decreasing, the variable concentration of gallium would further incrementally increase and then decrementally decrease again. For example, from the reference point RP54 to RP62, the incremental increase, the decremental decrease, the incremental increase, and the decremental decrease in sequence occur with respect to the reference point RP54.

Similarly, with respect to some of the reference points, after decrementally decreasing and then incrementally increasing, the variable concentration of gallium would further decrementally decrease and then incrementally increase again. For example, from the reference point RP56 to RP64, the decremental decrease, the incremental increase, the decremental decrease, and the incremental increase in sequence occur with respect to the reference point RP56.

With respect to the variable concentration of gallium in the buffer layer 110, the cyclical oscillation can be found between two of the reference points RP54-RP64 or among more than two of the reference points RP54-RP64. Furthermore, for any different three of the reference points RP54-RP64, it can be found that the variable concentration of gallium occurring at the middle one would "incrementally increase and then decrementally decrease" or "decrementally decrease and then incrementally increase". Such characterization can be identical or similar to the variable concentration of aluminum.

Figure 11:
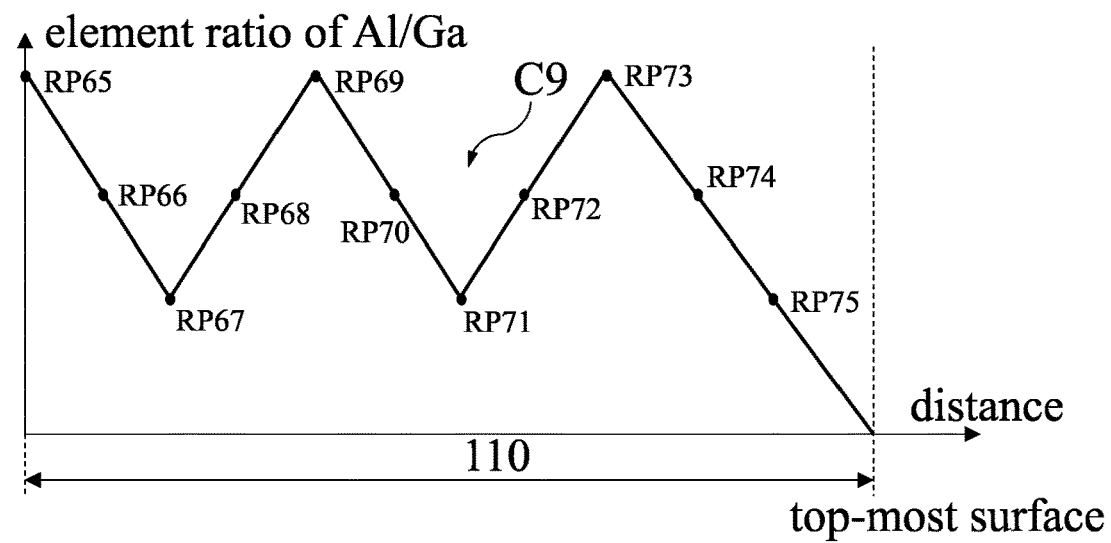
FIG. 11 is a graph showing an element ratio of aluminum to gallium in a buffer layer versus a distance within a thickness of the same according to some embodiments of the present disclosure.

FIG. 11 is a graph showing an element ratio of aluminum to gallium in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 11 reflects a relationship curve C9 for an element ratio of aluminum to gallium in the buffer layer 110. To illustrate, reference points RP65, RP66, RP67, RP68, RP69, RP70, RP71, RP72, RP73, RP74, and RP75 are labeled on the relationship curve C9 for convenient reference, in which the reference points RP65-RP75 are positioned within a thickness of the buffer layer 110.

In the exemplary illustration of FIG. 11, the relationship curve C9 has continuous decremental decreases and incremental increases. Similarly, regarding a change rate of the continuous decremental decreases and incremental increases, it would be constant. For example, the change rate of the decremental decrease (decrease degree per distance) from the reference point RP65 to the reference point RP66 is the same as that of the decremental decrease from the reference point RP66 to the reference point RP67. The relationship curve C9 still goes up and down repeatedly, such that at least one part of the relationship curve C9 can be an oscillating curve/a cyclical curve changing periodically (i.e. a periodic curve). Such oscillating curve/cyclical curve would have a slope in constant, because the change rate of the incremental increases or the decremental decrease is constant. That is, the relationship curve C9 can be a wave function, such as triangular wave, triangle wave, or other waves in non-sinusoidal waveforms.

As afore-described, the element ratio of aluminum to gallium changes corresponding to the variations of the concentrations of the two different group III elements, and it would have the trend similar to that of the variation of the concentration of aluminum (e.g. the illustration in FIG. 9).

With respect to the reference points RP65, RP66, RP69, or RP70, as the measurement of the element ratio is performed from the reference point along a direction away from the bottom-most surface of the buffer layer 110, the element ratio decrementally decreases and then incrementally increases.

With respect to the reference points RP68, RP69, RP72, or RP73, as the measurement of the element ratio is performed from the reference point along a direction away from the top-most surface of the buffer layer 110, the element ratio decrementally decreases and then incrementally increases.

With respect to the reference points RP67, RP68, RP71, or RP72, as the measurement of the element ratio is performed from the reference point along a direction away from the bottom-most surface of the buffer layer 110, the element ratio incrementally increases and then decrementally decreases.

With respect to the reference points RP70, RP71, RP74, or RP75, as the measurement of the element ratio is performed from the reference point along a direction away from the top-most surface of the buffer layer 110, the element ratio incrementally increases and then decrementally decreases.

With respect to some of the reference points, after decrementally decreasing and then incrementally increasing, the element ratio would further decrementally decrease and then incrementally increase again. For example, from the reference point RP65 to RP73, the decremental decrease, the incremental increase, the decremental decrease, and the incremental increase in sequence occur with respect to the reference point RP65.

Similarly, with respect to some of the reference points, after incrementally increasing and then decrementally decreasing, the element ratio would further incrementally increase and then decrementally decrease again. For example, from the reference point RP67 to RP75, the incremental increase, the decremental decrease, the incremental increase, and the decremental decrease in sequence occur with respect to the reference point RP45.

With respect to the element ratio in the buffer layer 110, the cyclical oscillation can be found between two of the reference points RP65-RP75 or among more than two of the reference points RP65-RP75. Furthermore, for any different three of the reference points RP65-RP75, it can be found that the element ratio occurring at the middle one would "incrementally increase and then decrementally decrease" or "decrementally decrease and then incrementally increase". Such characterization can be identical or similar to the variable concentration of aluminum.

Figure 12:
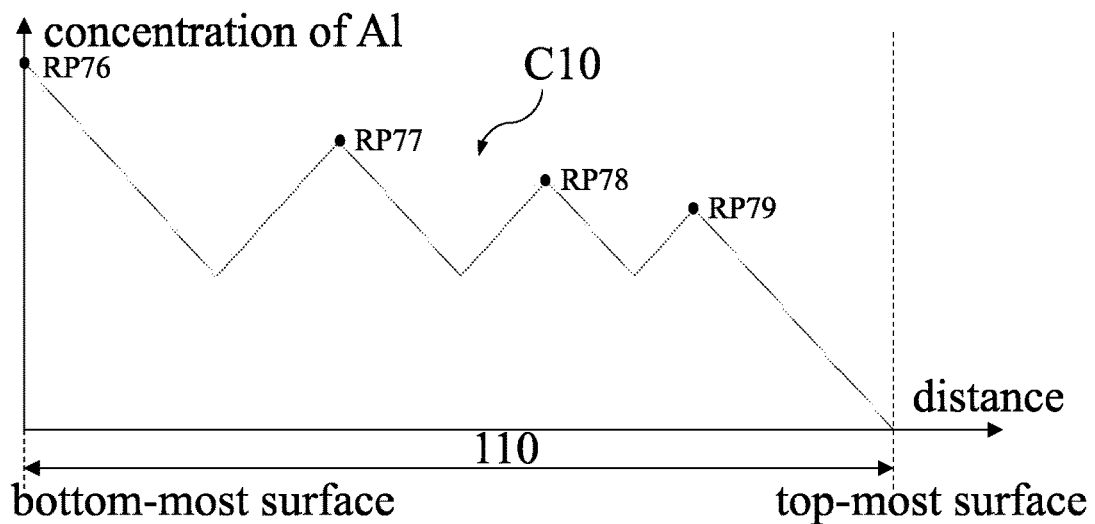
FIG. 12 is a graph showing a variable concentration of aluminum in a buffer layer versus a distance within a thickness of the same according to some embodiments of the present disclosure.

FIG. 12 is a graph showing a variable concentration of aluminum in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 12 reflects a relationship curve C10 for a variable concentration of aluminum in the buffer layer 110. To illustrate, reference points RP76, RP77, RP78, and RP79 are labeled on the relationship curve C10 for convenient reference, in which the reference points RP76-RP79 are positioned within a thickness of the buffer layer 110. In the exemplary illustration of FIG. 12, the relationship curve C10 has continuous incremental increases and decremental decreases and a change rate of them is contact, such that at least one part of the relationship curve C10 can be an oscillating curve/a cyclical curve changing periodically (i.e. a periodic curve), as previously stated.

In particular, a maximum concentration of aluminum with each period successively changes. More specifically, there are four maximum concentrations of aluminum in the relationship curve C10, which are positioned at reference points RP76, RP77, RP78, and R79. That is, as the distance from the bottom-most surface of the buffer layer gets farther, the maximum concentrations become less correspondingly. Although the maximum concentrations become less, the trend of the variable concentration of aluminum still varies in fluctuation (i.e. getting up and down repeatedly) and thus it can be called a periodic curve.

Figure 13:
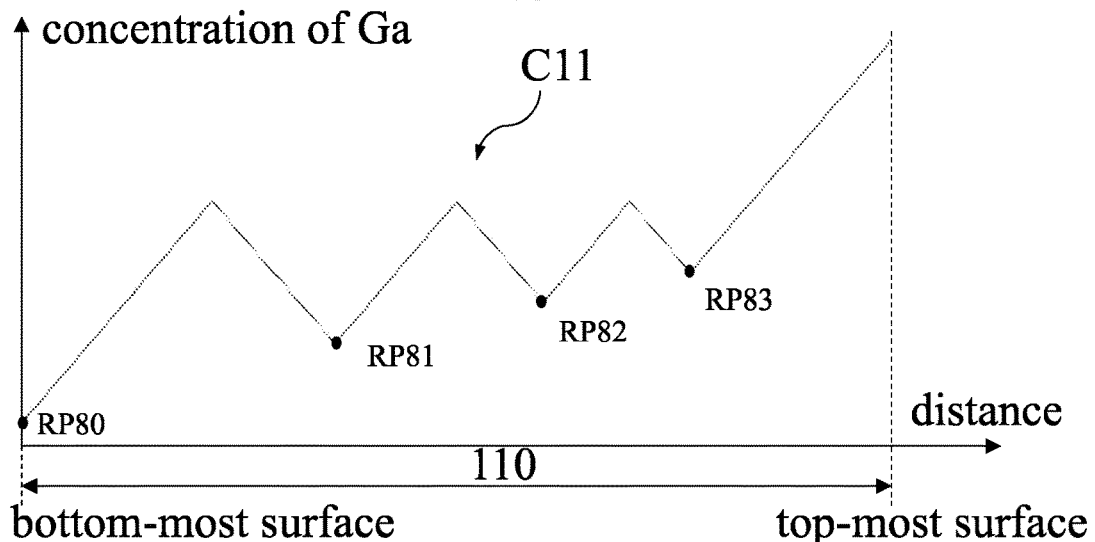
FIG. 13 is a graph showing a variable concentration of gallium in a buffer layer versus a distance within a thickness of the same according to some embodiments of the present disclosure.

FIG. 13 is a graph showing a variable concentration of gallium in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 13 reflects a relationship curve C11 for a variable concentration of gallium in the buffer layer 110. To illustrate, reference points RP80, RP81, RP82, and RP83 are labeled on the relationship curve C11 for convenient reference, in which the reference points RP80-RP83 are positioned within a thickness of the buffer layer 110. In the exemplary illustration of FIG. 13, the relationship curve C11 has continuous incremental increases and decremental decreases and a change rate of them is constant, such that at least one part of the relationship curve C11 can be an oscillating curve/a cyclical curve changing periodically (i.e. a periodic curve), as previously stated.

As afore-described, since the trend of the variable concentration of gallium would be contrary to that of the variable concentration of aluminum, the minimum concentration of gallium with each period would successively change, corresponding to the maximum concentration of aluminum with each period successively changing. More specifically, there three minimum concentrations of gallium in the relationship curve C11, which are positioned at reference points RP80, RP81, RP82, and RP83. That is, as the distance from the bottom-most surface of the buffer layer gets farther, the minimum concentrations become greater correspondingly. Although the minimum concentrations become greater, the trend of the variable concentration of gallium still varies in fluctuation (i.e. getting up and down repeatedly) and thus it can be called a periodic curve.

Figure 14:
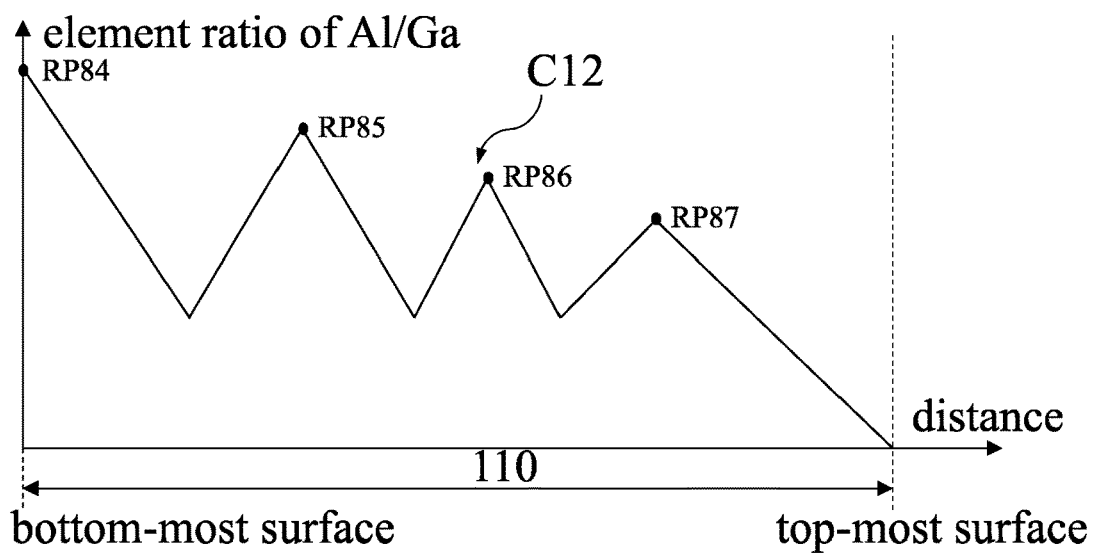
FIG. 14 is a graph showing an element ratio of aluminum to gallium in a buffer layer versus a distance within a thickness of the same according to some embodiments of the present disclosure.

FIG. 14 is a graph showing an element ratio of aluminum to gallium in a buffer layer 110 versus a distance within a thickness of the same according to some embodiments of the present disclosure. The X-axis represents a distance from a bottom-most surface of the buffer layer 110, and is in an arbitrary unit. The bottom-most surface and the top-most surface of the buffer layer 110 are labeled on the corresponding locations at X-axis for convenient reference. The Y-axis represents the value of the concentration of aluminum in the buffer layer 110, where the unit is "%."

The graph of FIG. 14 reflects a relationship curve C12 for an element ratio of aluminum to gallium in the buffer layer 110. To illustrate, reference points RP84, RP85, RP86, and RP87 are labeled on the relationship curve C12 for convenient reference, in which the reference points RP84-RP87 are positioned within a thickness of the buffer layer 110. In the exemplary illustration of FIG. 14, the relationship curve C12 has continuous incremental increases and decremental decreases and a change rate of them varies, such that at least one part of the relationship curve C12 can be an oscillating curve/a cyclical curve changing periodically (i.e. a periodic curve).

As afore-described, the element ratio of aluminum to gallium changes corresponding to the variations of the concentrations of the two different group III elements, and it would have the trend similar to that of the variation of the concentration of aluminum. Accordingly, a maximum value of the element ratio with each period successively changes. More specifically, there three maximum values of the element ratio in the relationship curve C12, which are positioned at reference points RP84 RP85, RP86, and RP87. That is, as the distance from the bottom-most surface of the buffer layer gets farther, the maximum values of the element ratio become less correspondingly. Although the maximum values of the element ratio become less, the trend of the element ratio still varies in fluctuation (i.e. getting up and down repeatedly) and thus it can be called a periodic curve.

Figure 15A:
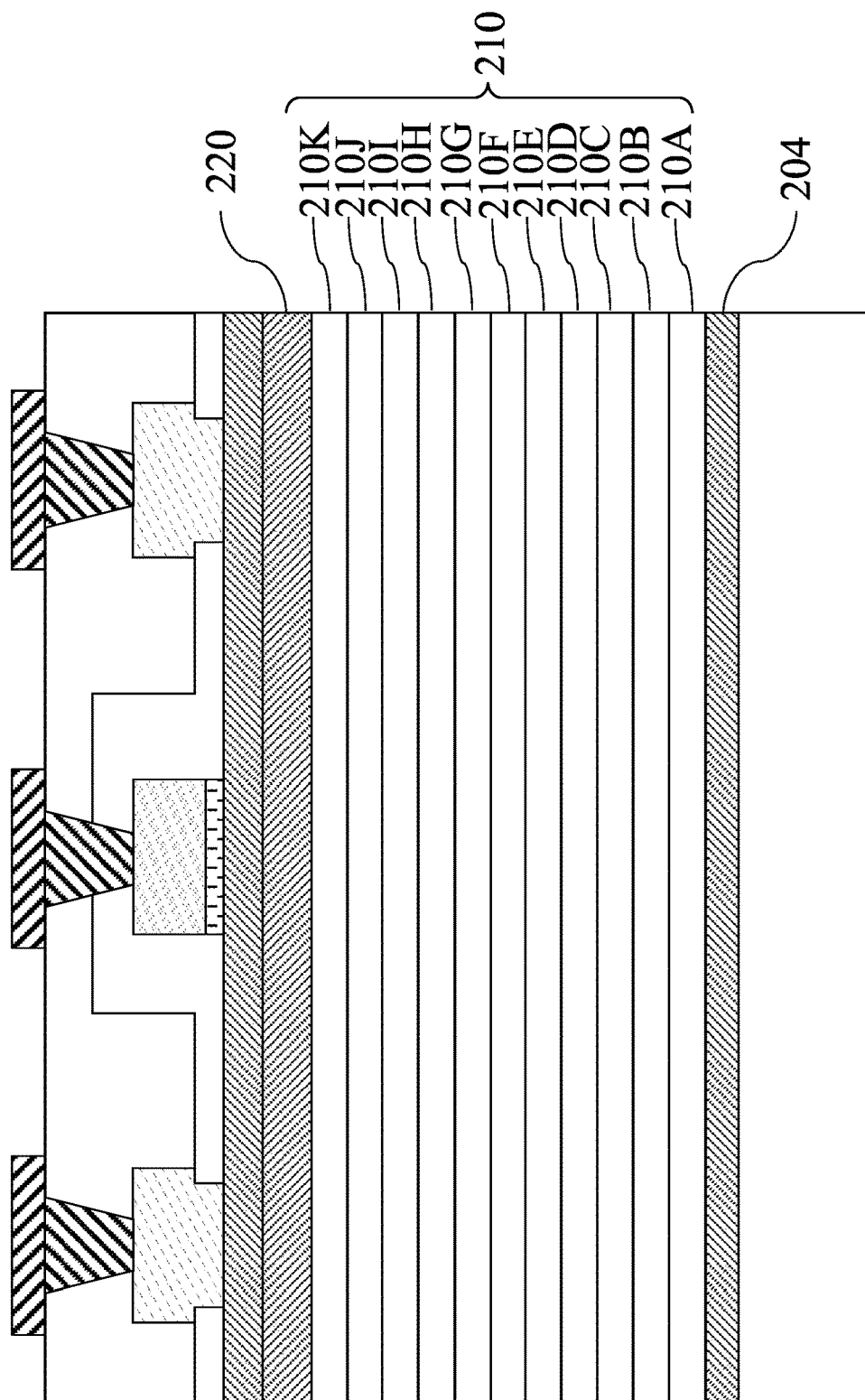
FIG. 15A is a cross-sectional view of a semiconductor device according to some embodiments of the present disclosure.

FIG. 15A is a cross-sectional view of a semiconductor device 200 according to some embodiments of the present disclosure. The semiconductor device 200 has a configuration identical or similar to that of the semiconductor device 200 except a buffer layer 210. The semiconductor device 200 includes the buffer layer 210 between a nucleation layer 204 and a nitride-based semiconductor layer 220. The buffer layer 210 in contact with the nucleation layer 204 and the nitride-based semiconductor layer 220.

The buffer layer 210 includes a III-V compound. The III-V compound can include, for example but are not limited to, aluminum, gallium, indium, nitride, or combinations thereof. Accordingly, the exemplary materials of the buffer layer 210 can further include, for example but are not limited to, AlN, AlGaN, InAlGaN, or combinations thereof.

The buffer layer includes sub-layers 210A-210K stacked sequentially from the nucleation layer 204. In some embodiments, a distinguishable interface exists between adjacent two of the sub-layers 210A-210K. The interfaces are parallel with a bottom-most surface of the buffer layer 210. In alternative embodiments, the adjacent two of the sub-layers 210A-210K may be merged and thus there is no distinguishable interface therebetween. The forming processes for the sub-layers 210A-210K are respectively individual. For example, the recipes of the forming processes for the sub-layers 210A and 210B are different. Moreover, during a forming process for one of the sub-layers 210A-210J, the configuration or the recipe would be kept the same. As such, each of the sub-layers 210A-210J can have a homogeneous/uniform concentration of a desired element.

Figure 15B:
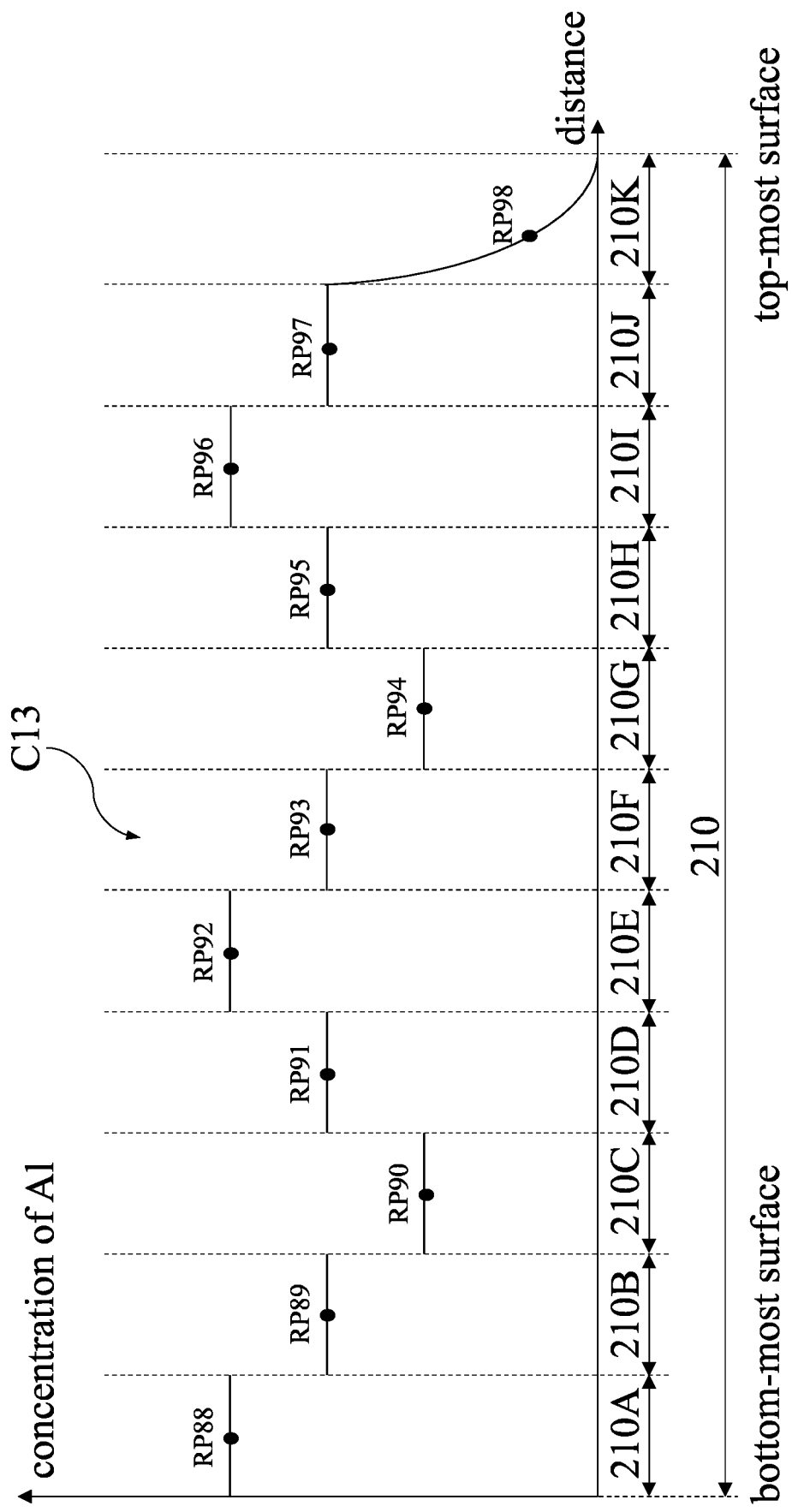
FIG. 15B is a graph showing the variable concentration of aluminum in the buffer layer versus a distance within a thickness of the buffer layer of FIG. 15A according to some embodiments of the present disclosure.

FIG. 15B is a graph showing the variable concentration of aluminum in the buffer layer 210 versus a distance within a thickness of the buffer layer 210 of FIG. 15A according to some embodiments of the present disclosure. As shown in FIGS. 15A and 15B, each of the sub-layers 210A-210J has a homogeneous/uniform concentration of aluminum. The adjacent two of the sub-layers 210A-210J have different concentrations of aluminum, such that the concentration of aluminum in the buffer layer 210 would be expressed as a function of the distance within a thickness of the buffer layer 210. Moreover, with forming the sub-layers 210A-210J having different concentrations of aluminum, the concentration of aluminum in the buffer layer 210 can have a trend in incremental increases and decremental decreases. In this regard, since each of the sub-layers 210A-210J has a homogeneous/uniform concentration of aluminum, the graph of the concentration of aluminum versus a distance within a thickness of the buffer layer is a stepwise function.

More specifically, as shown in FIG. 15B, the X-axis represents a distance from a bottom-most surface of the buffer layer 210, and is in an arbitrary unit. The bottom-most surface and the top-most surface of the buffer layer 210 are labeled on the corresponding locations at X-axis for convenient reference. The Y-axis represents the value of the concentration of aluminum in buffer layer 210, where the unit is "%."

The graph reflects a relationship curve C13 for the concentration of aluminum in buffer layer 210. To illustrate, reference points RP88, RP89, RP90, RP91, RP92, RP93, RP94, RP95, RP96, RP97, and RP98 are labeled on the relationship curve C13 for convenient reference, in which the reference points RP88-RP98 are positioned within the thickness of the buffer layer 210.

In the exemplary illustration of FIG. 15B, the relationship curve C13 has stepwise incremental increases and decremental decreases, such that at least one part of the relationship curve C13 can be an oscillating curve/a cyclical curve changing periodically (i.e. a periodic curve). That is, the trend of the concentration of aluminum varies in fluctuation (i.e. getting up and down repeatedly) and thus it can be called a periodic curve. In addition, with respect to each of the sub-layers 210A-210J, the graph has a slope in constant.

With respect to the reference points RP88, RP89, RP92, or RP93, as the measurement of the variable concentration of aluminum is performed from the reference point along a direction away from the bottom-most surface of the buffer layer 210, the variable concentration of aluminum decrementally decreases and then incrementally increases.

With respect to the reference points RP91, RP92, RP95, or RP96, as the measurement of the variable concentration of aluminum is performed from the reference point along a direction away from the top-most surface of the buffer layer 210, the variable concentration of aluminum decrementally decreases and then incrementally increases.

With respect to the reference points RP90, RP91, RP94, or RP95, as the measurement of the variable concentration of aluminum is performed from the reference point along a direction away from the bottom-most surface of the buffer layer 210, the variable concentration of aluminum incrementally increases and then decrementally decreases.

With respect to the reference points RP93, RP94, RP97, or RP98, as the measurement of the variable concentration of aluminum is performed from the reference point along a direction away from the top-most surface of the buffer layer 210, the variable concentration of aluminum incrementally increases and then decrementally decreases.

With respect to some of the reference points, after decrementally decreasing and then incrementally increasing, the variable concentration of aluminum would further decrementally decrease and then incrementally increase again. For example, from the reference point RP88 to RP96, the decremental decrease, the incremental increase, the decremental decrease, and the incremental increase in sequence occur with respect to the reference point RP88.

Similarly, with respect to some of the reference points, after incrementally increasing and then decrementally decreasing, the variable concentration of aluminum would further incrementally increase and then decrementally decrease again. For example, from the reference point RP90 to RP97, the incremental increase, the decremental decrease, the incremental increase, and the decremental decrease in sequence occur with respect to the reference point RP90.

With respect to the variable concentration of aluminum in the buffer layer 210, the cyclical oscillation can be found between two of the reference points RP88-RP97 or among more than two of the reference points RP88-RP97. Furthermore, for any different three of the reference points RP88-RP97, it can be found that the variable concentration of aluminum occurring at the middle one would "incrementally increase and then decrementally decrease" or "decrementally decrease and then incrementally increase". Such characterization can be identical or similar to the variable concentration of aluminum.

The sub-layer 210K is the top-most layer in the buffer layer 210 and has the variable concentration of aluminum that decrementally decreases to about zero (i.e. exact zero or slightly greater than zero).

The decremental decrease or the incrementally increase may be the same or different. For example, in some embodiments, variance in the concentration of aluminum between the sub-layers 210A and 210B is the same as variance in the concentration of aluminum between the sub-layers 210A and 210B. In other embodiments, variance in the concentration of aluminum between the sub-layers 210A and 210B is different than variance in the concentration of aluminum between the sub-layers 210A and 210B.

The sub-layers 210K can be formed by different approaches, such that the variation of the aluminum concentration in the sub-layers 210K may be different than FIG. 15B, such as different gradient or sustained thickness. For example, in some embodiments, the aluminum concentration in the sub-layers 210K may linearly and decrementally decrease.

Figure 16:
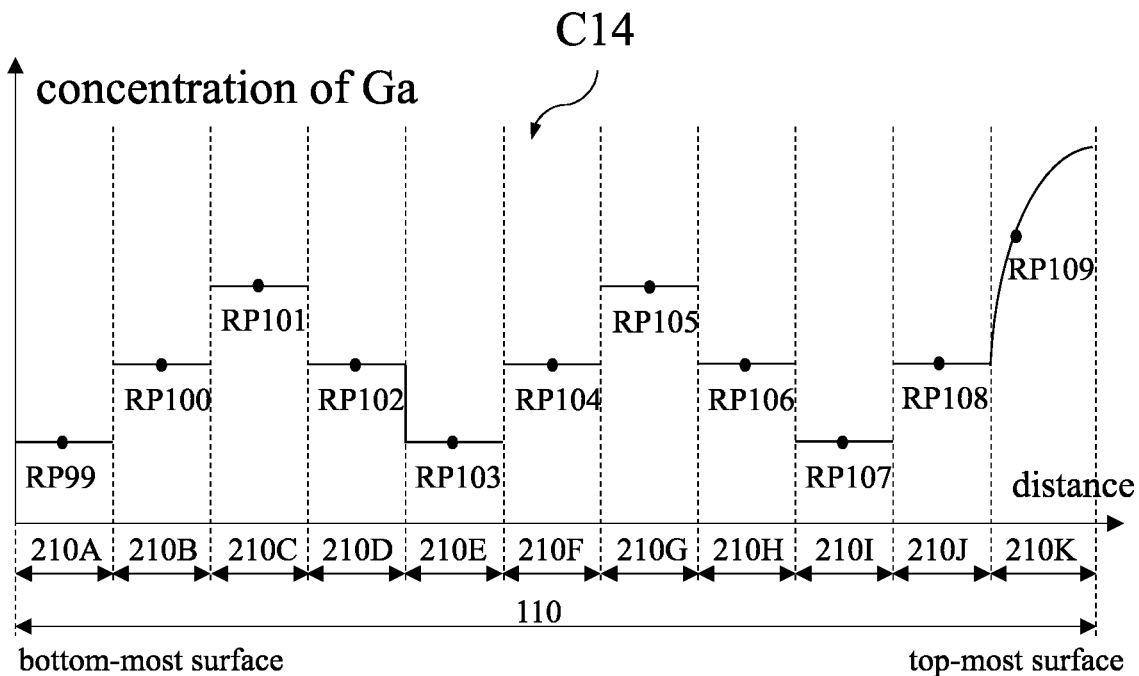
FIG. 16 is a graph showing a variable concentration of gallium in a buffer layer versus a distance within a thickness of the same according to some embodiments of the present disclosure.

FIG. 16 is a graph showing a variable concentration of gallium in a buffer layer 210 versus a distance within a thickness of the same according to some embodiments of the present disclosure. The X-axis represents a distance from a bottom-most surface of the buffer layer 210, and is in an arbitrary unit. The bottom-most surface and the top-most surface of the buffer layer 210 are labeled on the corresponding locations at X-axis for convenient reference. The Y-axis represents the value of the concentration of aluminum in buffer layer 210, where the unit is "%."

The graph of FIG. 16 reflects a relationship curve C14 for a variable concentration of gallium in the buffer layer 210. To illustrate, reference points RP99, RP100, RP101, RP102, RP103, RP104, RP105, RP106, RP107, RP108, and RP109 are labeled on the relationship curve C14 for convenient reference, in which the reference points RP99-RP109 are positioned within a thickness of the buffer layer 210.

In the exemplary illustration of FIG. 16, the relationship curve C14 has stepwise incremental increases and decremental decreases, such that at least one part of the relationship curve C14 can be an oscillating curve/a cyclical curve changing periodically (i.e. a periodic curve). That is, the trend of the concentration of gallium varies in fluctuation (i.e. getting up and down repeatedly) and thus it can be called a periodic curve. In addition, with respect to each of the sub-layers 210A-210J, the graph has a slope in constant.

As afore-described, the trend of the variable concentration of gallium would be contrary to that of the variable concentration of aluminum (i.e. be contrary to the trend illustrated in FIG. 15B).

With respect to the reference points RP99, RP100, RP103, or RP104, as the measurement of the variable concentration of gallium is performed from the reference point along a direction away from the bottom-most surface of the buffer layer 210, the variable concentration of gallium incrementally increases and then decrementally decreases.

With respect to the reference points RP102, RP103, RP106, or RP107, as the measurement of the variable concentration of gallium is performed from the reference point along a direction away from the top-most surface of the buffer layer 210, the variable concentration of gallium incrementally increases and then decrementally decreases.

With respect to the reference points RP101, RP102, RP105, or RP106, as the measurement of the variable concentration of gallium is performed from the reference point along a direction away from the bottom-most surface of the buffer layer 210, the variable concentration of gallium decrementally decreases and then incrementally increases.

With respect to the reference points RP104, RP105, RP108, or RP109, as the measurement of the variable concentration of gallium is performed from the reference point along a direction away from the top-most surface of the buffer layer 210, the variable concentration of gallium decrementally decreases and then incrementally increases.

With respect to some of the reference points, after incrementally increasing and then decrementally decreasing, the variable concentration of gallium would further incrementally increase and then decrementally decrease again. For example, from the reference point RP99 to RP107, the incremental increase, the decremental decrease, the incremental increase, and the decremental decrease in sequence occur with respect to the reference point RP99.

Similarly, with respect to some of the reference points, after decrementally decreasing and then incrementally increasing, the variable concentration of gallium would further decrementally decrease and then incrementally increase again. For example, from the reference point RP101 to RP108, the decremental decrease, the incremental increase, the decremental decrease, and the incremental increase in sequence occur with respect to the reference point RP101.

With respect to the variable concentration of gallium in the buffer layer 210, the cyclical oscillation can be found between two of the reference points RP99-RP108 or among more than two of the reference points RP99-RP108. Furthermore, for any different three of the reference points RP99-R108, it can be found that the variable concentration of gallium occurring at the middle one would "incrementally increase and then decrementally decrease" or "decrementally decrease and then incrementally increase". Such characterization can be identical or similar to the variable concentration of gallium.

Figure 17:
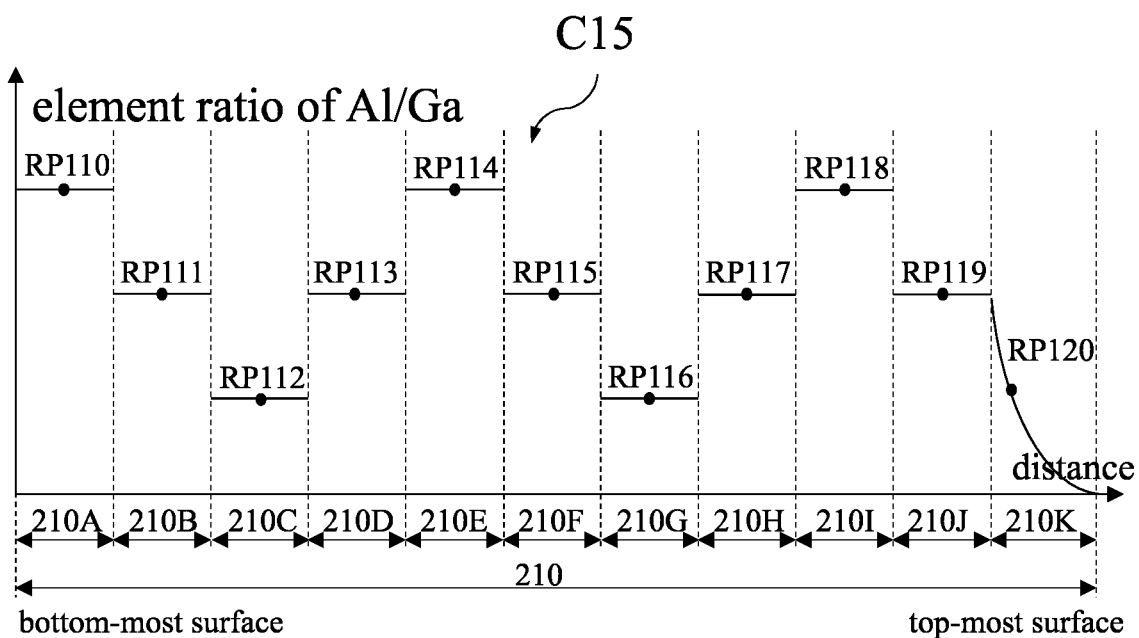
FIG. 17 is a graph showing an element ratio of aluminum to gallium in a buffer layer versus a distance within a thickness of the same according to some embodiments of the present disclosure.

FIG. 17 is a graph showing an element ratio of aluminum to gallium in a buffer layer 210 versus a distance within a thickness of the same according to some embodiments of the present disclosure. The X-axis represents a distance from a bottom-most surface of the buffer layer 210, and is in an arbitrary unit. The bottom-most surface and the top-most surface of the buffer layer 110 are labeled on the corresponding locations at X-axis for convenient reference. The Y-axis represents the value of the concentration of aluminum in buffer layer 210, where the unit is "%."

The graph of FIG. 17 reflects a relationship curve C15 for an element ratio of aluminum to gallium in the buffer layer 110. To illustrate, reference points RP110, RP111, RP112, RP113, RP114, RP115, RP116, RP117, RP118, RP119, and RP120 are labeled on the relationship curve C15 for convenient reference, in which the reference points RP110-RP120 are positioned within a thickness of the buffer layer 110.

In the exemplary illustration of FIG. 17, the relationship curve C15 has stepwise decremental decreases and incremental increases, such that at least one part of the relationship curve C15 can be an oscillating curve/a cyclical curve changing periodically (i.e. a periodic curve). That is, the trend of the element ratio varies in fluctuation (i.e. getting up and down repeatedly) and thus it can be called a periodic curve. In addition, with respect to each of the sub-layers 210A-210J, the graph has a slope in constant.

As afore-described, the element ratio of aluminum to gallium changes corresponding to the variations of the concentrations of the two different group III elements, and it would have the trend similar to that of the variation of the concentration of aluminum (e.g. the illustration in FIG. 15B).

With respect to the reference points RP110, RP111, RP114, or RP115, as the measurement of the element ratio is performed from the reference point along a direction away from the bottom-most surface of the buffer layer 110, the element ratio decrementally decreases and then incrementally increases.

With respect to the reference points RP113, RP114, RP117, or RP118, as the measurement of the element ratio is performed from the reference point along a direction away from the top-most surface of the buffer layer 110, the element ratio decrementally decreases and then incrementally increases.

With respect to the reference points RP112, RP113, RP116, or RP117, as the measurement of the element ratio is performed from the reference point along a direction away from the bottom-most surface of the buffer layer 210, the element ratio incrementally increases and then decrementally decreases.

With respect to the reference points RP115, RP116, RP119, or RP120, as the measurement of the element ratio is performed from the reference point along a direction away from the top-most surface of the buffer layer 210, the element ratio incrementally increases and then decrementally decreases.

With respect to some of the reference points, after decrementally decreasing and then incrementally increasing, the element ratio would further decrementally decrease and then incrementally increase again. For example, from the reference point RP110 to RP118, the decremental decrease, the incremental increase, the decremental decrease, and the incremental increase in sequence occur with respect to the reference point RP110.

Similarly, with respect to some of the reference points, after incrementally increasing and then decrementally decreasing, the element ratio would further incrementally increase and then decrementally decrease again. For example, from the reference point RP112 to RP119, the incremental increase, the decremental decrease, the incremental increase, and the decremental decrease in sequence occur with respect to the reference point RP112.

With respect to the element ratio in the buffer layer 210, the cyclical oscillation can be found between two of the reference points RP110-RP120 or among more than two of the reference points RP110-RP120. Furthermore, for any different three of the reference points RP110-RP120, it can be found that the element ratio occurring at the middle one would "incrementally increase and then decrementally decrease" or "decrementally decrease and then incrementally increase". Such characterization can be identical or similar to the element ratio.

In FIGS. 15B, 16, and 17, the stepwise incremental increase or decremental decrease is expressed by "three steps", which depends on the numbers of the sub-layers. For example, as shown in FIG. 15B, the first or decremental decrease occurs across the sub-layers 210A-210C, which involves three layers. In some embodiments, the decremental decrease may occur across more than three layers.

Figure 18:
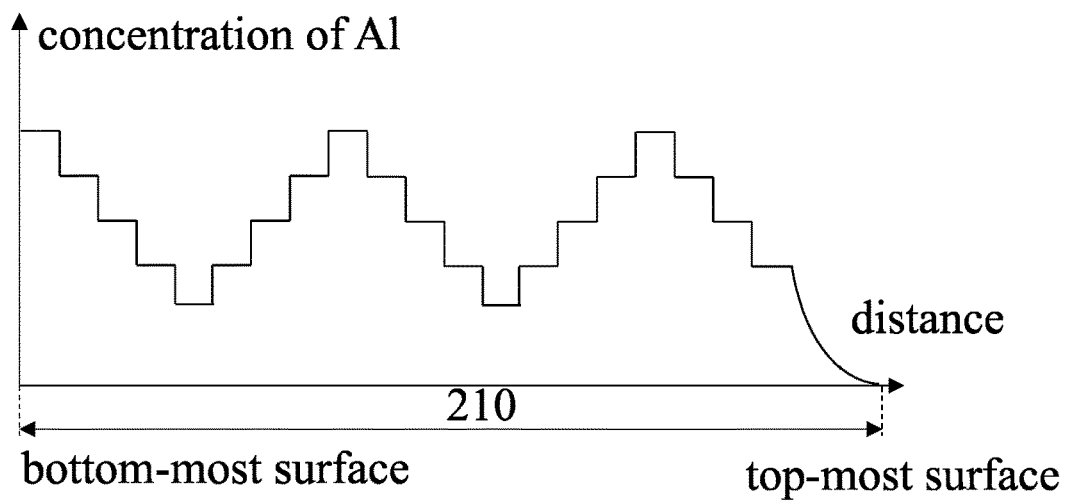
FIGS. 18, 19, and 20 are graphs respectively showing a variable concentration of aluminum, a variable concentration of gallium, and an element ratio of aluminum to gallium in a buffer layer versus a distance within a thickness of the same according to some embodiments of the present disclosure.
Figure 19:
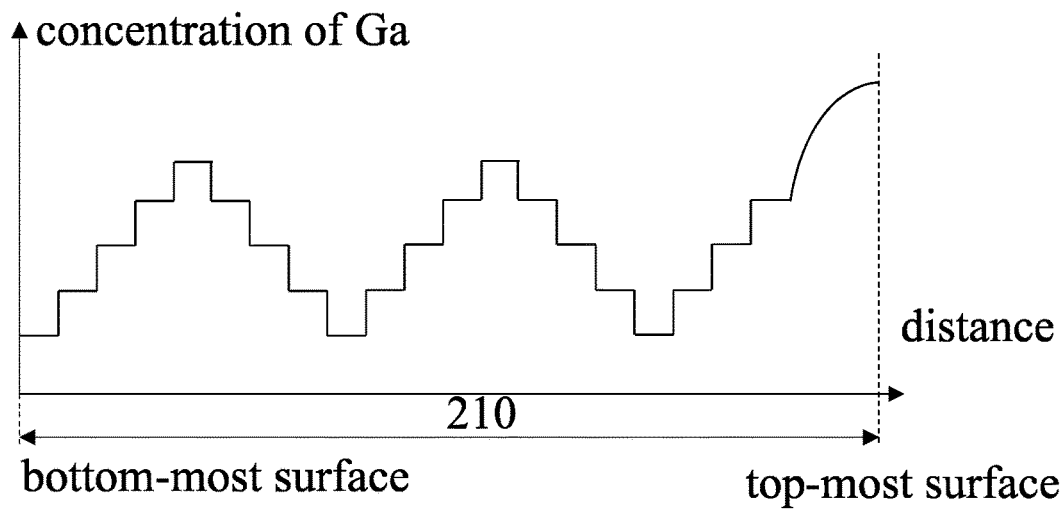
Figure 20:
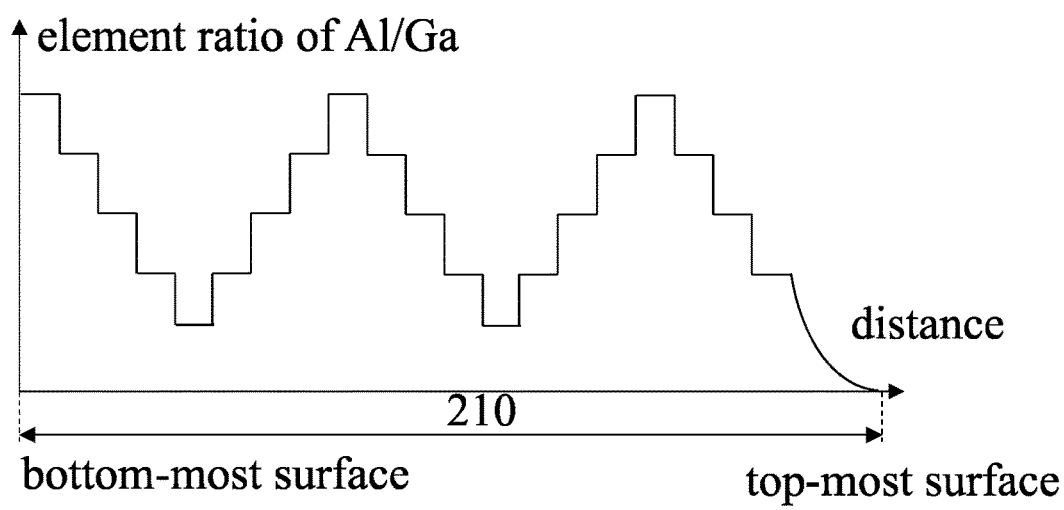

FIGS. 18, 19, and 20 are graphs respectively showing a variable concentration of aluminum, a variable concentration of gallium, and an element ratio of aluminum to gallium in a buffer layer 210 versus a distance within a thickness of the same according to some embodiments of the present disclosure. With respect to each decremental decrease or incremental increase, it can be constructed by five sub-layers of the buffer layer 210. Therefore, the number of the sub-layers for constructing each decremental decrease or incremental increase is flexible and can be turned according to the practical requirements.

Figure 21:
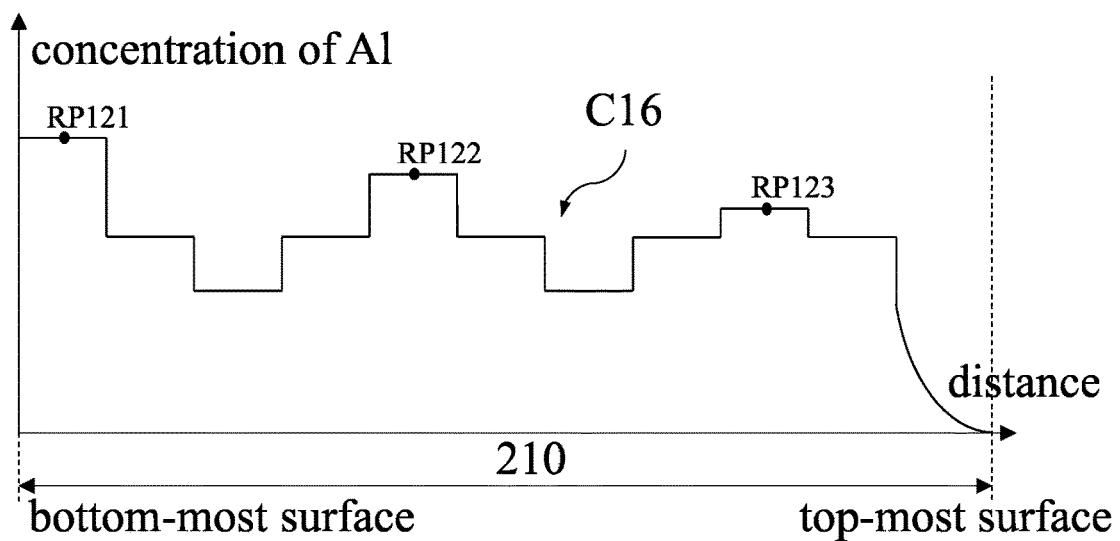
FIG. 21 is a graph showing a variable concentration of aluminum in a buffer layer versus a distance within a thickness of the same according to some embodiments of the present disclosure.

FIG. 21 is a graph showing a variable concentration of aluminum in a buffer layer 210 versus a distance within a thickness of the same according to some embodiments of the present disclosure. The X-axis represents a distance from a bottom-most surface of the buffer layer 210, and is in an arbitrary unit. The bottom-most surface and the top-most surface of the buffer layer 210 are labeled on the corresponding locations at X-axis for convenient reference. The Y-axis represents the value of the concentration of aluminum in buffer layer 210, where the unit is "%."

The graph of FIG. 21 reflects a relationship curve C16 for a variable concentration of aluminum in the buffer layer 210. To illustrate, reference points RP121, RP122, and RP123 are labeled on the relationship curve C16 for convenient reference, in which the reference points RP121-RP123 are positioned within a thickness of the buffer layer 210. In the exemplary illustration of FIG. 21, the relationship curve C16 has stepwise decremental decreases and incremental increases, such that at least one part of the relationship curve C16 can be an oscillating curve/a cyclical curve changing periodically (i.e. a periodic curve), as previously stated.

In particular, a maximum concentration of aluminum with each period successively changes. More specifically, there are three maximum concentrations of aluminum in the relationship curve C16, which are positioned at reference points RP121, RP122, and RP123. That is, as the distance from the bottom-most surface of the buffer layer gets farther, the maximum concentrations become less correspondingly. Although the maximum concentrations become less, the trend of the variable concentration of aluminum still varies in fluctuation (i.e. getting up and down repeatedly) and thus it can be called a periodic curve.

Figure 22:
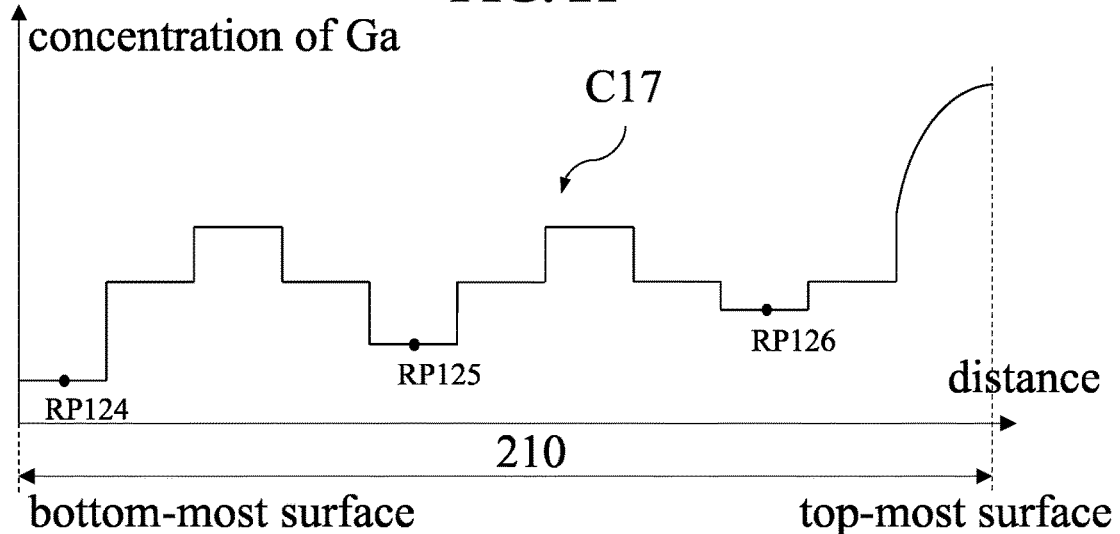
FIG. 22 is a graph showing a variable concentration of gallium in a buffer layer versus a distance within a thickness of the same according to some embodiments of the present disclosure.

FIG. 22 is a graph showing a variable concentration of gallium in a buffer layer 210 versus a distance within a thickness of the same according to some embodiments of the present disclosure. The X-axis represents a distance from a bottom-most surface of the buffer layer 210, and is in an arbitrary unit. The bottom-most surface and the top-most surface of the buffer layer 210 are labeled on the corresponding locations at X-axis for convenient reference. The Y-axis represents the value of the concentration of aluminum in buffer layer 210, where the unit is "%."

The graph of FIG. 22 reflects a relationship curve C17 for a variable concentration of gallium in the buffer layer 210. To illustrate, reference points RP124, RP125, and RP126 are labeled on the relationship curve C17 for convenient reference, in which the reference points RP124-RP126 are positioned within a thickness of the buffer layer 210. In the exemplary illustration of FIG. 22, the relationship curve C17 has stepwise incremental increases and decremental decreases, such that at least one part of the relationship curve C17 can be an oscillating curve/a cyclical curve changing periodically (i.e. a periodic curve), as previously stated.

As afore-described, since the trend of the variable concentration of gallium would be contrary to that of the variable concentration of aluminum, the minimum concentration of gallium with each period would successively change, corresponding to the maximum concentration of aluminum with each period successively changing. More specifically, there are three minimum concentrations of gallium in the relationship curve C17, which are positioned at reference points RP124, RP125, and RP126 That is, as the distance from the bottom-most surface of the buffer layer gets farther, the minimum concentrations become greater correspondingly. Although the minimum concentrations become greater, the trend of the variable concentration of gallium still varies in fluctuation (i.e. getting up and down repeatedly) and thus it can be called a periodic curve.

Figure 23:
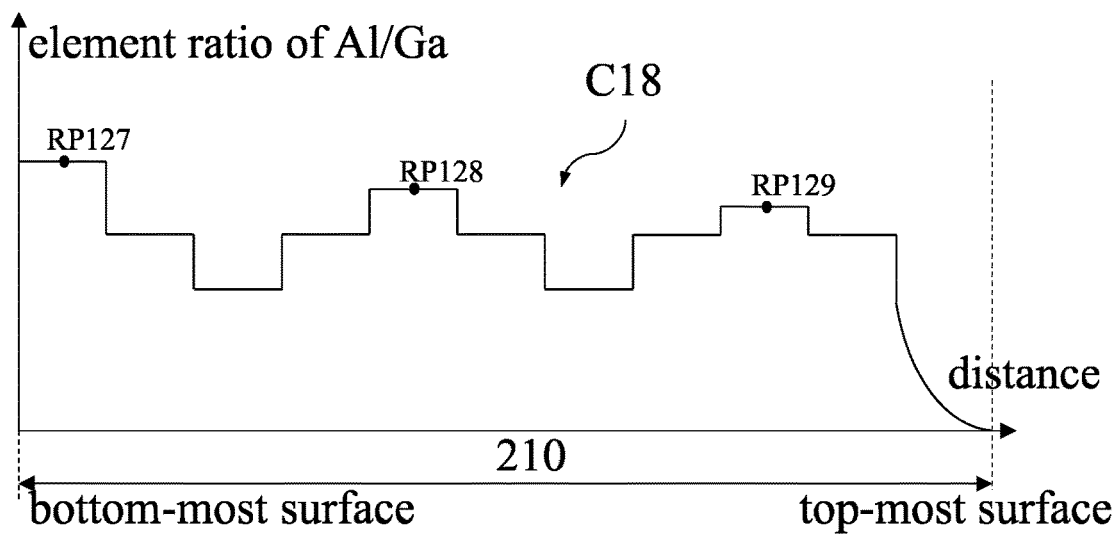
FIG. 23 is a graph showing an element ratio of aluminum to gallium in a buffer layer versus a distance within a thickness of the same according to some embodiments of the present disclosure.

FIG. 23 is a graph showing an element ratio of aluminum to gallium in a buffer layer 210 versus a distance within a thickness of the same according to some embodiments of the present disclosure. The X-axis represents a distance from a bottom-most surface of the buffer layer 210, and is in an arbitrary unit. The bottom-most surface and the top-most surface of the buffer layer 210 are labeled on the corresponding locations at X-axis for convenient reference. The Y-axis represents the value of the concentration of aluminum in buffer layer 210, where the unit is "%."

The graph of FIG. 23 reflects a relationship curve C18 for an element ratio of aluminum to gallium in the buffer layer 210. To illustrate, reference points RP127, RP128, and RP129 are labeled on the relationship curve C18 for convenient reference, in which the reference points RP127-RP129 are positioned within a thickness of the buffer layer 210. In the exemplary illustration of FIG. 23, the relationship curve C18 has step incremental increases and decremental decreases, such that at least one part of the relationship curve C18 can be an oscillating curve/a cyclical curve changing periodically (i.e. a periodic curve).

As afore-described, the element ratio of aluminum to gallium changes corresponding to the variations of the concentrations of the two different group III elements, and it would have the trend similar to that of the variation of the concentration of aluminum. Accordingly, a maximum value of the element ratio with each period successively changes. More specifically, there three maximum values of the element ratio in the relationship curve C18, which are positioned at reference points RP127, RP128, and RP129. That is, as the distance from the bottom-most surface of the buffer layer gets farther, the maximum values of the element ratio become less correspondingly. Although the maximum values of the element ratio become less, the trend of the element ratio still varies in fluctuation (i.e. getting up and down repeatedly) and thus it can be called a periodic curve.

Figure 24:
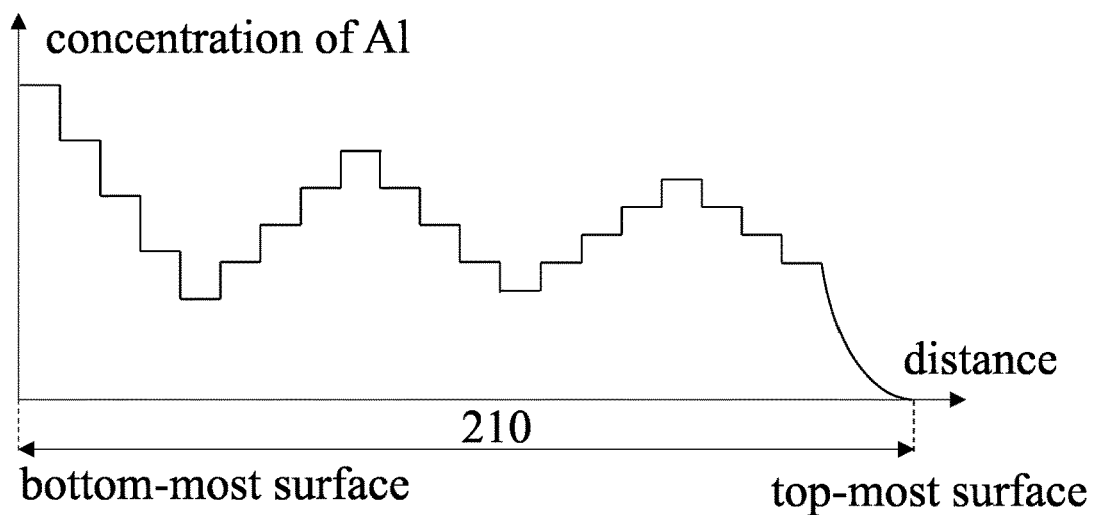
FIGS. 24, 25, and 26 are graphs respectively showing a variable concentration of aluminum, a variable concentration of gallium, and an element ratio of aluminum to gallium in a buffer layer versus a distance within a thickness of the same according to some embodiments of the present disclosure.
Figure 25:
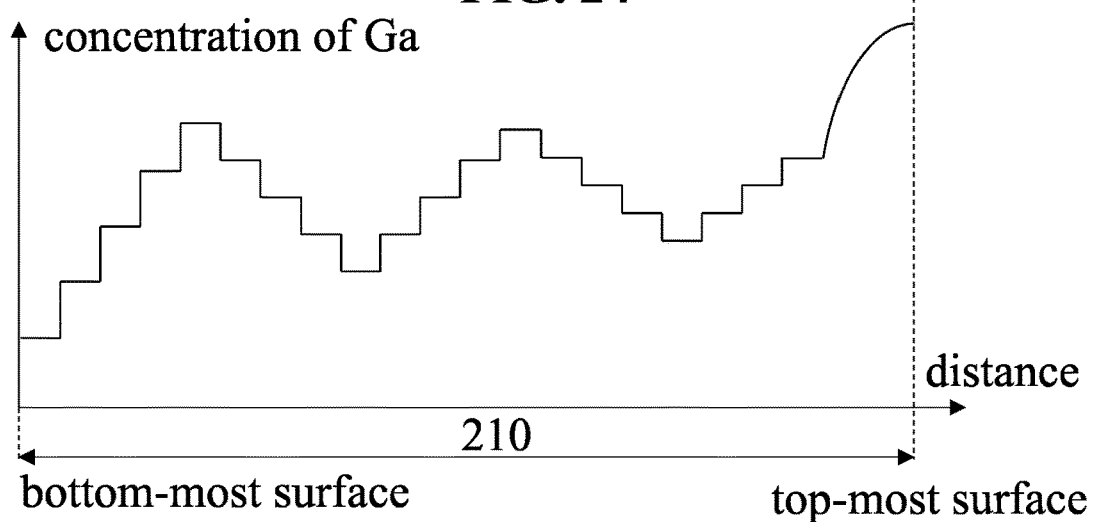
Figure 26:
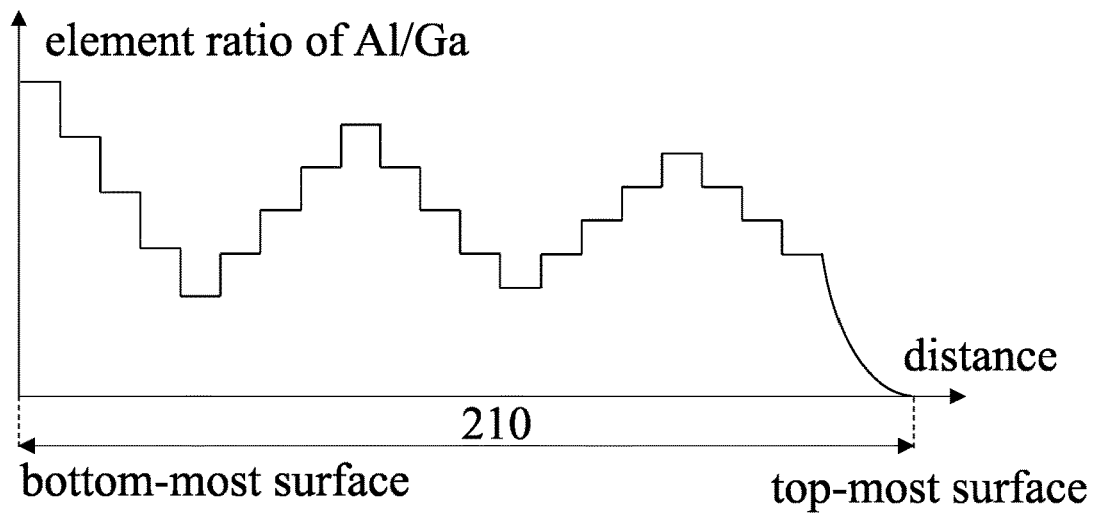

Similarly, in some embodiments, the decremental decrease may occur across more than three layers. FIGS. 24, 25, and 26 are graphs respectively showing a variable concentration of aluminum, a variable concentration of gallium, and an element ratio of aluminum to gallium in a buffer layer 210 versus a distance within a thickness of the same according to some embodiments of the present disclosure. With respect to each decremental decrease or incremental increase, it can be constructed by five sub-layers of the buffer layer. Therefore, the number of the sub-layers for constructing each decremental decrease or incremental increase is flexible and can be turned according to the practical requirements.

Figure 27:
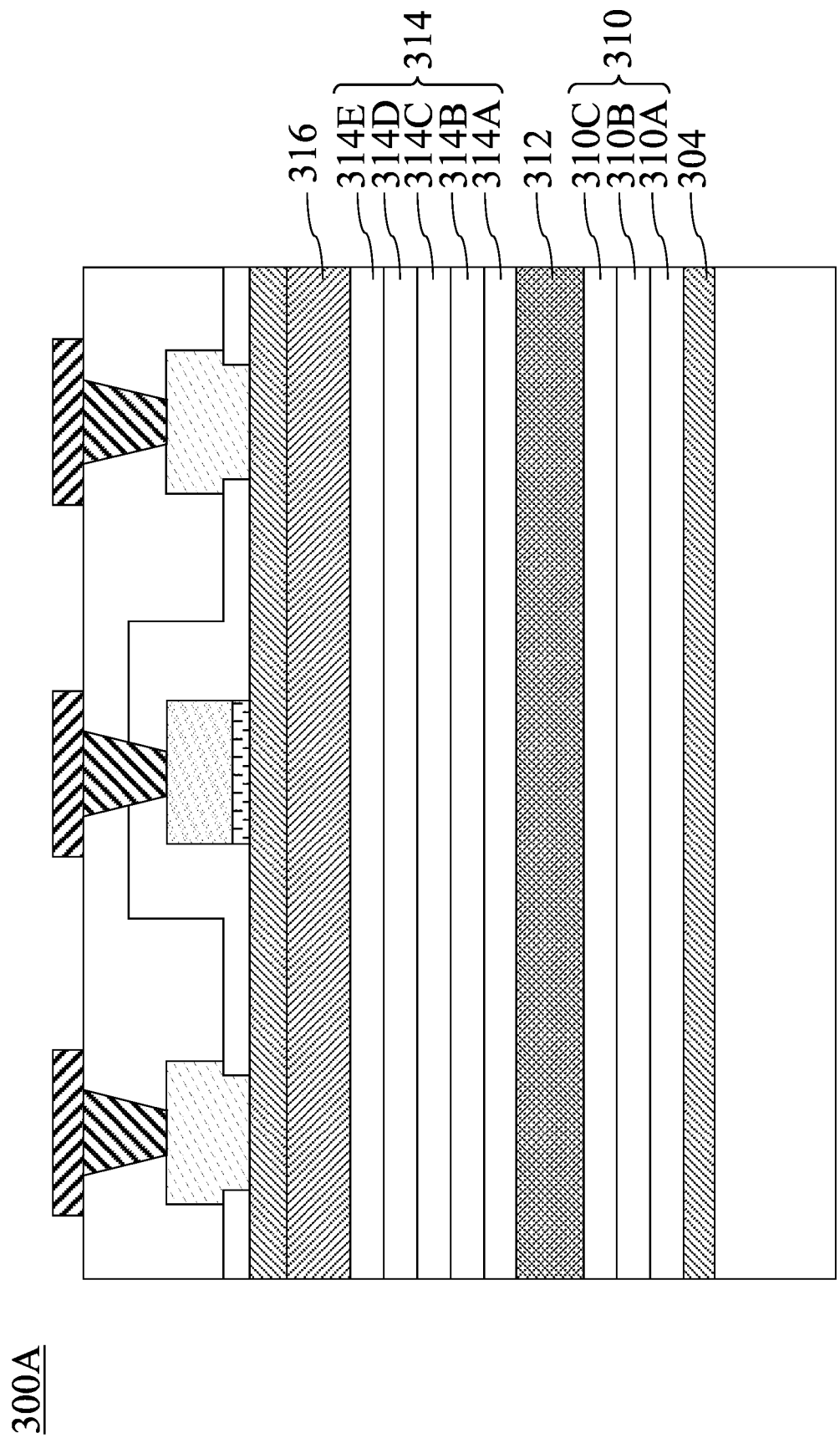
FIG. 27 is a cross-sectional view of a semiconductor device according to some embodiments of the present disclosure.

FIG. 27 is a cross-sectional view of a semiconductor device 300 according to some embodiments of the present disclosure. The semiconductor device 300 has a configuration identical or similar to that of the semiconductor device 100 or 200 except a nitride-based semiconductor layer 312 and a buffer layer 314.

The semiconductor device 300 includes a nucleation layer 304 and the buffer layer 310 directly stacked on the nucleation layer 304. The nucleation layer 304 can be formed to be the same as the afore-stated nucleation layer 104. The buffer layer 310 can be formed the same as one of the above embodiments. For example, the buffer layer 310 can be formed to include AlGaN which has a afore-discussed variable concentration of aluminum/gallium.

The nitride-based semiconductor layer 312 is directly formed on the buffer layer 310. The nitride-based semiconductor layer 312 forms an interface with the buffer layer 310. The exemplary materials of the nitride-based semiconductor layer 312 can include, for example but are not limited to, nitrides or group III-V compounds, such as GaN, AlN, InN, $In_xAl_yGa_{(1-x-y)}N$ where $x+y\le1$, $Al_yGa_{(1-y)}N$ where $y\le1$.

The buffer layer 314 is directly formed on the nitride-based semiconductor layer 312. The buffer layer 314 forms an interface with the nitride-based semiconductor layer 312. The nitride-based semiconductor layer 316 is directly formed on the buffer layer 314. The nitride-based semiconductor layer 316 forms an interface with the buffer layer 314.

In some embodiments, under the configuration that the buffer layer 310 is formed to include a group III element, the buffer layer 314 can be formed to include another one group III element. For example, the buffer layer 310 includes aluminum and the buffer layer 314 includes indium. Accordingly, the exemplary materials of the buffer layer 314 can further include, for example but are not limited to, $In_xAl_yGa_{(1-x-y)}N$ where $x+y\le1$, $In_yGa_{(1-y)}N$ where $y\le1$, or combinations thereof.

In some embodiments, the buffer layer 310 includes a group III-V aluminum-based compound and the buffer layer 314 includes a group III-V indium-based compound. The buffer layers 310 and 314 can be made of the same compound or different compounds. The nitride-based semiconductor layers 312 and 316 are devoid of aluminum and indium. According to such configuration, the buffer layers 310 and 314 can construct various combinations as follows.

One of the configurations for the buffer layers 310 and 314 is that the buffer layer 310 includes $Al_xGa_{(1-x)}N$ where $x\le1$ and the buffer layer 314 includes $In_yGa_{(1-y)}N$ where $y\le1$. In some embodiments, the buffer layer 310 may have a variable concentration of aluminum that varies with respect to a reference point within a thickness of the buffer layer 310 (e.g. an incremental increase or a decremental decrease), as afore-discussed above. In other embodiments, the buffer layer 310 can be formed to have a concentration of aluminum which is strictly decremental decrease.

Regarding the buffer layer 314, at least one group III element in the buffer layer 314 can vary, which is similar to aluminum in the buffer layer 310, such that the buffer layer 314 would have a variable concentration of indium. For example, from the nitride-based semiconductor layer 312 to the nitride-based semiconductor layer 316, the variable concentration of indium may at least incrementally increase and then decrementally decrease. That is, the concentration of indium in the buffer layer 314 can vary to cyclically oscillate as a function of a distance within a thickness of the buffer layer 314. The cyclical oscillation may occur with respect to a reference point within the buffer layer 314.

The trend of the cyclical oscillation may depend on a position of a reference point. For some reference points, the cyclical oscillation may include an incremental increase, a decremental decrease, an incremental increase, and a decremental decrease occurring sequentially with respect to the reference point within the buffer layer 314. For other reference points, the cyclical oscillation may include a decremental decrease, an incremental increase, a decremental decrease, and an incremental increase occurring sequentially with respect to a reference point within the buffer layer 314. In some embodiments, the cyclical oscillation of indium in the buffer layer 314 is continuous. In some embodiments, the cyclical oscillation of indium in the buffer layer 314 is stepwise.

The properties/characters of the variable concentration of indium in the buffer layer 314 can be designed as being identical or similar to the afore-discussed variable concentration of aluminum. As such, a graph of the concentration of indium in the buffer layer 314 versus the distance within the thickness of the buffer layer 314 is an oscillating curve. In some embodiments, at least one part of the oscillating curve changes periodically. In some embodiments, the graph is a periodic curve, and a maximum concentration of indium with each period successively changes.

One of the configurations for the buffer layers 310 and 314 is that the buffer layer 310 includes $Al_xGa_{(1-x)}N$ where $x\le1$ and the buffer layer 314 includes $Al_yIn_zGa_{(1-y-z)}N$ where $y+z\le1$. In some embodiments, the buffer layers 310 may have a variable concentration of aluminum that varies with respect to a reference point within a thickness of the buffer layer 310 (e.g. an incremental increase or a decremental decrease), as afore-discussed above. In other embodiments, the buffer layer 310 can be formed to have a concentration of aluminum which is strictly decremental decrease. Regarding the buffer layer 314, y in $Al_yIn_zGa_{(1-y-z)}N$ can be constant while z is variable. That is, a portion of the buffer layer 314 may have a variable concentration of indium while have a constant concentration of aluminum. The constant concentration of aluminum in the buffer layer 314 may be lower than that of a portion of the buffer layer 310. For example, the constant concentration of aluminum in the buffer layer 314 is greater than 0% and less than 10%, and the concentration of aluminum in the buffer layer 310 can be greater than 10%.

One of the configurations for the buffer layers 310 and 314 is that the buffer layer 310 includes $Al_xIn_yGa_{(1-x-y)}N$ where x+y≤1 and the buffer layer 314 includes $In_yGa_{(1-y)}N$ where y≤1. In some embodiments, x in $Al_xIn_yGa_{(1-x-y)}N$ is variable while y in $Al_xIn_yGa_{(1-x-y)}N$ can be constant. That is, a portion of the buffer layer 310 may have a variable concentration of aluminum while have a constant concentration of indium. Regarding the buffer layer 314, it can have a variable concentration of indium, as previously discussed. The constant concentration of indium in the buffer layer 310 may be lower than that of a portion of the buffer layer 314. For example, the constant concentration of indium in the buffer layer 310 is greater than 0% and less than 10%, and the concentration of indium in the buffer layer 314 can be greater than 10%.

One of the configurations for the buffer layers 310 and 314 is that the buffer layer 310 includes $Al_xIn_yGa_{(1-x-y)}N$ where x+y≤1 and the buffer layer 314 includes $Al_zIn_wGa_{(1-z-w)}N$ where z+w≤1. In some embodiments, x in $Al_xIn_yGa_{(1-x-y)}N$ is variable while y in $Al_xIn_yGa_{(1-x-y)}N$ can be constant. That is, a portion of the buffer layer 310 may have a variable concentration of aluminum while have a constant concentration of indium. Regarding the buffer layer 314, z in $Al_zIn_wGa_{(1-z-w)}N$ can be constant while w is variable. That is, a portion of the buffer layer 314 may have a variable concentration of indium while have a constant concentration of aluminum. The constant concentration of indium in the buffer layer 310 may be lower than that of a portion of the buffer layer 314. For example, the constant concentration of indium in the buffer layer 310 is greater than 0% and less than 10%, and the concentration of indium in the buffer layer 314 can be greater than 10%. The constant concentration of aluminum in the buffer layer 314 may be lower than that of a portion of the buffer layer 310. For example, the constant concentration of aluminum in the buffer layer 314 is greater than 0% and less than 10%, and the concentration of aluminum in the buffer layer 310 can be greater than 10%.

In some embodiments, the buffer layer 310 includes $Al_xIn_yGa_{(1-x-y)}N$ where x+y≤1, where x and y in $Al_xIn_yGa_{(1-x-y)}N$ are variable, and a trend of a variable concentration of aluminum is contrary to that of a variable concentration of indium. In some embodiments, the buffer layer 310 includes $Al_xIn_yGa_{(1-x-y)}N$ where x+y≤1, where x and y in $Al_xIn_yGa_{(1-x-y)}N$ are variable, and a trend of a variable concentration of aluminum is identical or similar to that of a variable concentration of indium.

In some embodiments, the buffer layer 314 includes $Al_zIn_wGa_{(1-z-w)}N$ where z+w≤1, where z and w in $Al_zIn_wGa_{(1-z-w)}N$ are variable, and a trend of a variable concentration of aluminum is contrary to that of a variable concentration of indium. In some embodiments, the buffer layer 314 includes $Al_zIn_wGa_{(1-z-w)}N$ where z+w≤1, where z and w in $Al_zIn_wGa_{(1-z-w)}N$ are variable, and a trend of a variable concentration of aluminum is identical or similar to that of a variable concentration of indium.

According to the embodiments above, multiple solutions for improving the accumulation of the stress during the formation of the buffer layer are provided, which means the process for manufacturing a semiconductor device applying such concept is flexible and thus can be generally applied. Therefore, those different solutions can be selected/chosen according to the conditions/requirements/demands of the manufacturing process.

Furthermore, the graphs involving the wave functions as stated above are illustrated for the exemplary purpose, and the present disclosure is not limited by them. Modification to them is possible and available. For example, increasing or decreasing the number of the cycles in the wave function is available. Modification to them is still in the spirit of the present disclosure.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
a substrate;
a nucleation layer comprising a compound including a first group III element and devoid of a second group III element, the nucleation layer disposed on and forming an interface with the substrate;
a buffer layer comprising a III-V compound including the first and second group III elements, the buffer layer disposed on and forming an interface with the nucleation layer, wherein the buffer layer has an element ratio of the first group III element to the second group III element that decrementally decreases and then incrementally increases as a function of a distance within a thickness of the buffer layer such that the buffer layer has a variable lattice constant in accordance with change of the element ratio, wherein the decremental decrease and incremental increase occur with respect to a first reference point within the buffer layer;
a first nitride-based semiconductor layer disposed on and forming an interface with the buffer layer, wherein the element ratio of the buffer layer at the interface between the first nitride-based semiconductor layer and the buffer layer is less than the element ratio at rest parts of the buffer layer, wherein the rest parts of the buffer layer comprise entirety of the buffer layer not comprising the interface between the first nitride-based semiconductor layer and the buffer layer; wherein the buffer layer comprises sub-layers, the element ratio is constant within each of the sub-layers not comprising a topmost sub-layer, the element ratio in any two adjacent sub-layers is different, so that the element ratio decrementally decreases and incrementally increases in a stepwise manner within the sub-layers not comprising the topmost sub-layer, and the element ratio in the topmost sublayer decrementally decreases to zero in a continuous manner;
a second nitride-based semiconductor layer disposed on the first nitride-based semiconductor layer and having a bandgap greater than a bandgap of the first nitride-based semiconductor layer, so as to form a heterojunction therebetween with a two-dimensional electron gas (2DEG) region; and
a pair of source/drain (S/D) electrodes and a gate electrode disposed over the second nitride-based semiconductor layer, wherein the gate electrode is between the S/D electrodes.

2. The semiconductor device of claim 1, wherein the element ratio decrementally decreases after the incremental increase occurring with respect to the first reference point within the buffer layer.

3. The semiconductor device of claim 2, wherein the element ratio incrementally increases again after the decremental decrease, such that the decremental decrease, the incremental increase, the decremental decrease, and the incremental increase in sequence occur with respect to the first reference point within the buffer layer.

4. The semiconductor device of claim 1, wherein the element ratio decrementally decreases and then incrementally increases with respect to a second reference point within the buffer layer, and the first and second points have different heights from a bottom-most surface of the buffer layer.

5. The semiconductor device of claim 4, wherein the element ratio incrementally increases and then decrementally decreases from a third reference point toward the first reference point, wherein the third reference point is present between the first and second reference points.

6. The semiconductor device of claim 4, wherein the element ratio decrementally decreases and then incrementally increases from a third reference point toward the first reference point, wherein the third reference point is present between the first and second reference points.

7. The semiconductor device of claim 1, wherein the element ratio incrementally increases and then decrementally decreases with respect to a second reference point within the buffer layer, and the first and second points have different heights from a bottom-most surface of the buffer layer.

8. The semiconductor device of claim 7, wherein the element ratio incrementally increases and then decrementally decreases from a third reference point toward the first reference point, wherein the third reference point is present between the first and second reference points.

9. The semiconductor device of claim 7, wherein the element ratio decrementally decreases and then incrementally increases from a third reference point toward the first reference point, wherein the third reference point is present between the first and second reference points.

10. The semiconductor device of claim 1, wherein a graph of the element ratio versus the distance within the thickness of the buffer layer is an oscillating curve, and at least one part of the oscillating curve changes periodically.

11. The semiconductor device of claim 1, wherein a graph of the element ratio versus the distance within the thickness of the buffer layer is a periodic curve, and wherein a maximum concentration of the first element with each period successively changes.

12. The semiconductor device of claim 1, wherein a graph of the element ratio versus the distance within the thickness of the buffer layer is a cyclical curve.

13. The semiconductor device of claim 1, wherein the buffer layer has a thickness in a range from about 1 μm to about 50 μm.

14. The semiconductor device of claim 1, wherein the first element is aluminium, the second element is gallium, and the first nitride-based semiconductor layer is devoid of aluminium and comprises gallium.

15. The semiconductor device of claim 1, wherein the buffer layer further comprises indium.

16. The semiconductor device of claim 1, wherein the element ratio changes due to both concentrations of the first and second group III elements varying, and the variation of the concentration of the first group III element negatively correlates with the variation of the concentration of the second group III element.

* * * * *